(12) United States Patent
Lee

(10) Patent No.: US 12,260,901 B2
(45) Date of Patent: Mar. 25, 2025

(54) SIGNAL INPUT BUFFER FOR EFFECTIVELY CALIBRATING OFFSET

(71) Applicant: FIDELIX CO., LTD., Seongnam-si (KR)

(72) Inventor: Jae Jin Lee, Gwangju-si (KR)

(73) Assignee: FIDELIX CO., LTD., Seongnam-si (KR)

( * ) Notice: Subject to any disclaimer, the term of this patent is extended or adjusted under 35 U.S.C. 154(b) by 155 days.

(21) Appl. No.: 18/099,744

(22) Filed: Jan. 20, 2023

(65) Prior Publication Data
US 2023/0326515 A1 Oct. 12, 2023

(30) Foreign Application Priority Data
Apr. 7, 2022 (KR) .................. 10-2022-0043506

(51) Int. Cl.
*G11C 11/40* (2006.01)
*G11C 5/06* (2006.01)
*G11C 11/4093* (2006.01)
*G11C 11/4096* (2006.01)

(52) U.S. Cl.
CPC .......... *G11C 11/4093* (2013.01); *G11C 5/063* (2013.01); *G11C 11/4096* (2013.01); *G11C 2207/2254* (2013.01)

(58) Field of Classification Search
CPC . G11C 11/4093; G11C 5/063; G11C 11/4096; G11C 2207/2254
See application file for complete search history.

(56) References Cited

U.S. PATENT DOCUMENTS

| | | | |
|---|---|---|---|
| 6,556,934 B2 * | 4/2003 | Higashide .......... | G01R 31/3191 702/89 |
| 7,072,355 B2 * | 7/2006 | Kizer ...................... | H03M 9/00 714/E11.207 |
| 10,660,197 B2 * | 5/2020 | Butcher ............... | H05K 1/0228 |

* cited by examiner

*Primary Examiner* — Vanthu T Nguyen
(74) *Attorney, Agent, or Firm* — KILE PARK REED & HOUTTEMAN PLLC

(57) ABSTRACT

A signal input buffer includes 1-st and 2-nd buffering blocks; a 1-st input switching block; a 2-nd input switching block; a 1-st output switching block; and a 2-nd output switching block. The signal input buffer buffers a reception signal pair and generates a buffered signal pair, and is capable of operation in a normal mode and a calibration mode, the reception signal pair includes an intrinsic reception signal and a complementary reception signal, the buffered signal pair includes an intrinsic buffered signal and a complementary buffered signal, and the calibration mode includes a 1-st calibration period and a 2-nd calibration period.

16 Claims, 20 Drawing Sheets

SIGNAL INPUT BUFFER FOR EFFECTIVELY CALIBRATING OFFSET

CROSS-REFERENCE TO RELATED APPLICATION

This application claims priority to and the benefit of Korean Patent Application No. 2022-0043506 under 35 U.S.C. § 119, filed on Apr. 7, 2022 in the Korean Intellectual Property Office (KIPO), the disclosure of which is incorporated herein by reference in its entirety.

BACKGROUND

1. Technical Field

The disclosure relates to a signal input buffer, and more specifically, to a signal input buffer that effectively calibrates for offset.

2. Description of the Related Art

A semiconductor memory device includes signal input buffers. Generally, the signal input buffers may be implemented as differential types. The signal input buffer may buffer a reception signal pair corresponding to an analog type external signal pair which is received through a data pad based, and may provide a buffered signal pair.

Semiconductor memory devices are becoming increasingly low-power and high-speed. Accordingly, the signal input buffer may be required to provide a buffered signal pair having an effective data value, even in case that there is a very small voltage difference between the reception signal pair.

In order to meet this demand, the signal input buffer is generally implemented in form of a differential amplifier. Between components symmetrically disposed in the differential amplifier, an offset may be generated due to an error in design, manufacturing process, package, etc. and a difference in external environment.

Due to the offset between the symmetrical components, the logic state of the buffered signal pair may be transitioned by erroneously recognizing the voltage magnitude relation of two signals forming a pair.

In order to calibrate such an offset, it is general that the signal input buffer has a function of calibrating the offset using a calibration code.

However, in the conventional signal input buffer, after the code value of the calibration code once set, the voltage level of the reception signal pair may be changed in a direction, and it is checked whether the transition of the buffered signal pair is correctly occurred. If it is checked (or determined) that an error occurs in the transition of the buffered signal pair, the code value of the calibration code may be changed and set. Then, the process of changing the two signals forming the reception signal pair in one-direction may be repeated again.

In such a conventional signal input buffer, a time required for offset calibration may be inefficiently increased.

SUMMARY

The disclosure is directed to a signal input buffer capable of effectively calibrating for offset.

In an embodiment, a signal input buffer according to the disclosure may include 1-st and 2-nd buffering blocks, each of the 1-st and 2-nd buffering blocks buffering its own input signal pair to generate its own output signal pair, and calibrating its own calibration code in a 1-st calibration period and a 2-nd calibration period, respectively, wherein the input signal pair may include an intrinsic input signal and a complementary input signal, and the output signal pair may include an intrinsic output signal and a complementary output signal; a 1-st input switching block that electrically connects a reception signal pair to the input signal pair of the 1-st buffering block in the 2-nd calibration period, and blocks electrical connection between the reception signal pair and the input signal pair of the 1-st buffering block in the 1-st calibration period; a 2-nd input switching block that electrically connects the reception signal pair to the input signal pair of the 2-nd buffering block in the 1-st calibration period, and blocks electrical connection between the reception signal pair and the input signal pair of the 2-nd buffering block in the 2-nd calibration period; a 1-st output switching block that electrically connects the output signal pair of the 1-st buffering block to a buffered signal pair in the 2-nd calibration period, and blocks electrical connection between the output signal pair of the 1-st buffering block and the buffered signal pair in the 1-st calibration period; and a 2-nd output switching block that electrically connects the output signal pair of the 2-nd buffering block to the buffered signal pair in the 1-st calibration period, and blocks electrical connection between the output signal pair of the 2-nd buffering block and the buffered signal pair in the 2-nd calibration period. The signal input buffer may buffer the reception signal pair and generate the buffered signal pair, and may be capable of operation in a normal mode and a calibration mode, the reception signal pair may include an intrinsic reception signal and a complementary reception signal, the buffered signal pair may include an intrinsic buffered signal and a complementary buffered signal, and the calibration mode may include the 1-st calibration period and the 2-nd calibration period.

A k-th input switching block may electrically connect the reception signal pair to the input signal pair of a k-th buffering block in the normal mode, 'k' being at least one of 1 and 2, and a k-th output switching block may electrically connect the output signal pair of the k-th buffering block to the buffered signal in the normal mode.

A k-th buffering block may include a switching circuit that controls the intrinsic input signal and the complementary input signal to a same voltage level in a k-th calibration period; a reception circuit that includes a reception response unit and a comparison response unit, and generates the output signal pair, wherein the reception response unit may have a reception response conductance which depends on a voltage of the intrinsic input signal, the comparison response unit may have a comparison response conductance which depends on a voltage of the complementary input signal, and the output signal pair may have a logic state depending on a magnitude relationship between the reception response conductance and the comparison response conductance in the k-th calibration period; and a code generating circuit that generates a calibration code including 1-st to n-th calibration signals sequentially activated, wherein the calibration code may be sequentially changed in k-th the calibration period in which a k-th calibration driving signal is activated, and is latched in response to a transition of the intrinsic output signal, a relative magnitude of the comparison response conductance to the reception response conductance may be sequentially changed according to the sequential change of the calibration code, in the k-th calibration period, and 'k' may be at least one of 1 and 2, and 'n' may be a natural number equal to greater than 2.

The reception circuit may further include a reception responding part that includes the reception response unit and the comparison response unit, wherein the reception response unit may be disposed between a common node and a reception intermediate node, the comparison response unit may be disposed between the common node and a comparison intermediate node, and the common node may be electrically connected to a power voltage according to activation of a buffer enable signal; and a reception amplifying part that is electrically connected to the reception intermediate node and the comparison intermediate node, and generates the intrinsic output signal and the complementary output signal.

The reception circuit may further include an enable transistor disposed between the power voltage and the common node, and may electrically connect common node to the power voltage in response to activation of the buffer enable signal.

The reception response unit may include a reception basic portion and a 1-st to a p-th response portions disposed in parallel with each other between the common node and the reception intermediate node, 'p' being a natural number smaller than n, the reception basic portion may have a reception basic conductance depending on the voltage of the intrinsic input signal, the 1-st to p-th response portions may be enabled in response to activation of a 1-st to a p-th calibration signal, respectively, and may have 1-st to p-th response conductances depending on the voltage of the intrinsic input signal, and the comparison response unit may include a comparison basic portion and (p+1) to n-th response portions disposed in parallel with each other between the common node and the comparison intermediate node, the comparison basic portion may have a comparison basic conductance depending on the voltage of the complementary input signal, and the (p+1)-th to n-th response portions may be enabled in response to activation of (p+1)-th to n-th calibration signals, respectively, and may have (p+1)-th to n-th response conductances depending on the voltage of the complementary input signal.

The 1-st to p-th response conductances may be sequentially decreased in the k-th calibration period, and the (p+1)-th to n-th response conductances may be sequentially increased in the k-th calibration period.

The comparison response unit may further include a precision response portion that is disposed in parallel with the comparison basic portion and the (p+1)-th to n-th response portions between the common node and the comparison intermediate node, is enabled in the k-th calibration period, and have a precision conductance depending on the voltage of the complementary input signal, and the precision conductance may be smaller than the (p+1)-th response conductance.

The reception response unit may further include a compensation response portion that is disposed in parallel with the reception basic portion and the 1-st to p-th response portions between the common node and the reception intermediate node, and is disenabled in the k-th calibration period.

'n' may be less than or equal to 2 to the power of 'q', 'q' being a natural number, and the code generating circuit may include a coding generating part that generates 1-st to q-th coding signals, wherein the 1-st coding signal may alternately rise and fall according to a pulse of an oscillating signal, the oscillating signal may be a pulse signal that is periodically and repeatedly activated in the k-th calibration period, and a t-th coding signal may alternately rise and fall according to a pulse of a (t−1)-th coding signal, T being a natural number from 2 to q; a sequential signal generating part that generates 1-st to n-th sequential signals with using the 1-st to q-th coding signals, wherein the 1-st to n-th sequential signal may be sequentially activated; a sequential enable generating part that generates a sequential enable signal, wherein the sequential enable signal may be activated in response to activation of the k-th calibration driving signal, and the sequential enable signal may be deactivated in response to a transition of the intrinsic output signal in the k-th calibration period; and a calibration signal generating part that generates the 1-st to n-th calibration signals with receiving the 1-st to n-th sequential signals, wherein a logic state of an i-th calibration signal may correspond to a logic state of an i-th sequential signal during activation of the sequential enable signal, and may be latched in response to deactivation of the sequential enable signal, T being a natural number from 1 to n.

The coding generating part may include 1-st to q-th coding generating units that generate the 1-st to q-th coding signals.

The 1-st coding generating unit may include a 1-st input code portion that receives an inverted signal of the 1-st coding signal and generates a 1-st input code signal, wherein the 1-st input code signal may be controlled to a logic state that is inverted from the inverted signal of the 1-st coding signal in response to an one-way transition of the oscillating signal, and may be latched as a first logic state in response to deactivation of the k-th calibration driving signal; and a 1-st output code portion that generates the 1-st coding signal with inverting the 1-st input code signal in response to other one-way transition of the oscillating signal.

The t-th coding generating unit may include a t-th input code portion that receives an inverted signal of the t-th coding signal and generates a t-th input code signal, wherein the t-th input code signal may be controlled to a logic state that is inverted from the inverted signal of the t-th coding signal in response to an one-way transition of the (t−1)-th coding signal, and may be latched as a first logic state in response to deactivation of the k-th calibration driving signal; and a t-th output code portion that generates the t-th coding signal with inverting the t-th input code signal in response to other one-way transition of the (t−1)-th coding signal.

The sequential enable generating part may include an output latch unit that generates the intrinsic output signal as an output latch signal in response to activation of a buffer enable signal; and a sequential enable generating unit that generates the sequential enable signal, wherein the sequential enable signal may be activated in response to the activation of the k-th calibration driving signal, and may be deactivated in response to a transition of the output latch signal in k-th calibration period.

The output latch unit may include a delay enable portion that generates a delay enable signal with using the buffer enable signal, wherein the delay enable signal may be activated in response to the activation of the buffer enable signal with a delay; and an output latch portion that generates the intrinsic output signal as the output latch signal in response to activation of the delay enable signal.

The sequential enable generating unit may include a calibration pulse generating portion that generates a calibration pulse in response to activation of the k-th calibration driving signal; a transition signal generating unit that generates a transition pulse in response to transition of the output latch signal; and a sequential enable generating unit that generates the sequential enable signal, wherein the sequential enable signal may be activated in response to a pulse generation of the calibration pulse, and may be deactivated in response to a pulse generation of the transition pulse.

The calibration signal generating part may include 1-st to n-th calibration generating units, and an i-th calibration generating unit may include a calibration switch that transmits the i-th sequential signal in case that the sequential enable signal is activated; and a calibration latch portion that generates an i-th calibration signal, wherein the logic state of the i-th calibration signal may correspond to the logic state of the i-th sequential signal transmitted through the calibration switch, and the logic state of the i-th calibration signal may be latched according to deactivation of the sequential enable signal.

In an embodiment, the signal input buffer according to the disclosure may comprise 1-st and 2-nd buffering blocks, each of the 1-st and 2-nd buffering blocks buffering its own intrinsic input signal to generate its own intrinsic output signal; a 1-st input switching block that electrically connects an intrinsic reception signal to the intrinsic input signal of the 1-st buffering block in a 2-nd calibration period, and blocks electrical connection between the intrinsic reception signal and the intrinsic input signal of the 1-st buffering block in a 1-st calibration period; a 2-nd input switching block that electrically connects the intrinsic reception signal to the intrinsic input signal of the 2-nd buffering block in the 1-st calibration period, and blocks electrical connection between the intrinsic reception signal and the intrinsic input signal of the 2-nd buffering block in the 2-nd calibration period; a 1-st output switching block that electrically connects the intrinsic output signal of the 1-st buffering block to an intrinsic buffered signal in the 2-nd calibration period, and blocks electrical connection between the intrinsic output signal of the 1-st buffering block and the intrinsic buffered signal in the 1-st calibration period; and a 2-nd output switching block that electrically connects the intrinsic output signal of the 2-nd buffering block to the intrinsic buffered signal in the 1-st calibration period, and blocks electrical connection between the intrinsic output signal of the 2-nd buffering block and the intrinsic buffered signal in the 2-nd calibration period. The signal input buffer may buffer the intrinsic reception signal and generating the intrinsic buffered signal, and may be capable of operation in a normal mode and a calibration mode, and the calibration mode may include the 1-st calibration period and the 2-nd calibration period.

A k-th input switching block may electrically connect the intrinsic reception signal to the intrinsic input signal of a k-th buffering block in the normal mode, 'k' being at least one of 1 and 2, and a k-th output switching block may electrically connect the intrinsic output signal of the k-th buffering block to the intrinsic buffered signal in the normal mode.

A k-th buffering block may include a switching circuit that controls the intrinsic input signal to a reference voltage in a k-th calibration period; a reception circuit that includes a reception response unit and a comparison response unit, and generates the intrinsic output signal, wherein the reception response unit may have a reception response conductance which depends on a voltage of the intrinsic input signal, the comparison response unit may have a comparison response conductance which depends on a reference voltage, and the intrinsic output signal may have a logic state depending on a magnitude relationship between the reception response conductance and the comparison response conductance in the k-th calibration period; and a code generating circuit that generates a calibration code including a 1-st to a n-th calibration signal sequentially activated, wherein the calibration code may be sequentially changed in k-th the calibration period in which a k-th calibration driving signal is activated, and may be latched in response to a transition of the intrinsic output signal. A relative magnitude of the comparison response conductance to the reception response conductance may be sequentially changed according to the sequential change of the calibration code, in the k-th calibration period, and 'k' may be at least one of 1 and 2, and 'n' may be a natural number equal to greater than 2.

It is to be understood that the embodiments above are described in a generic and explanatory sense only and not for the purpose of limitation, and the disclosure is not limited to the embodiments described above.

BRIEF DESCRIPTION OF THE DRAWINGS

The above and other objects, features and advantages of the disclosure will become more apparent to those skilled in the art by describing in detail exemplary embodiments thereof with reference to the accompanying drawings, in which.

DETAILED DESCRIPTION OF THE EMBODIMENTS

Figure 1:
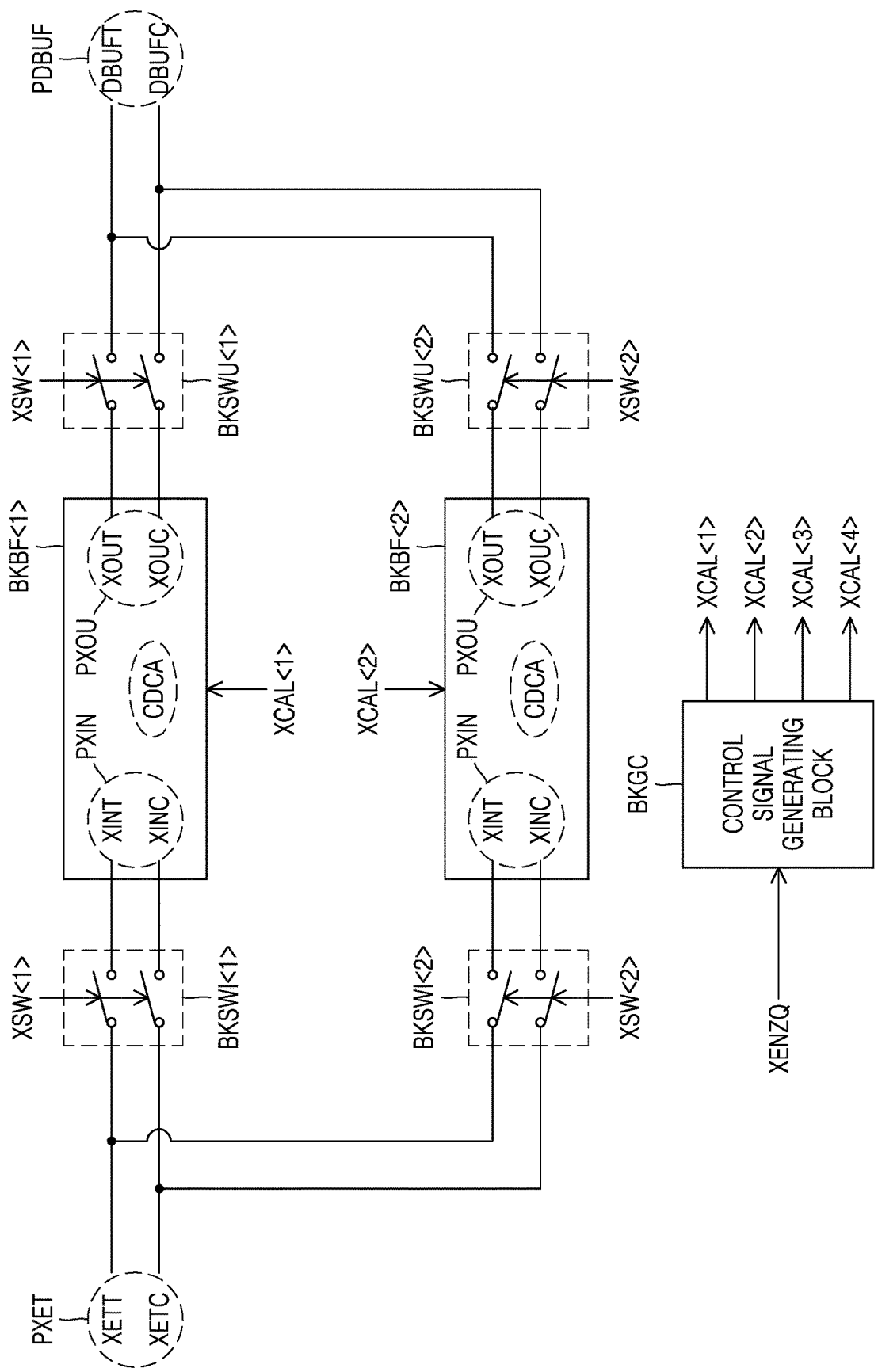
FIG. 1 is a schematic diagram illustrating the signal input buffer according to a first embodiment of the disclosure.

Embodiments of the disclosure will be described in detail below with reference to the accompanying drawings. While the disclosure is shown and described in connection with embodiments thereof, it will be apparent to those skilled in the art that various modifications can be made without departing from the spirit and scope of the disclosure. Thus, the scope of the disclosure is not limited to these particular following embodiments.

The terminology used herein is for the purpose of describing particular embodiments only and is not intended to be limiting of the disclosure. As used herein, the singular forms, such as "a" and "an," are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

The term "and/or" includes all combinations of one or more of which associated configurations may define. For example, "A and/or B" may be understood to mean "A, B, or A and B."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments of the disclosure will be described in detail with reference to the accompanying drawings.

First Embodiment

FIG. 1 is a schematic diagram illustrating the signal input buffer according to a first embodiment of the disclosure.

The signal input buffer of the first embodiment of the disclosure shown in FIG. 1 may buffer a reception signal pair PXET and generate a buffered signal pair PDBUF. The reception signal pair PXET may be an analog type, and the buffered signal pair PDBUF may be a digital type.

The reception signal pair PXET may include or consist of an intrinsic reception signal XETT and a complementary reception signal XETC, and the buffered signal pair PDBUF may include or consist of an intrinsic buffered signal DBUFT and a complementary buffered signal DBUFC.

Figure 2:
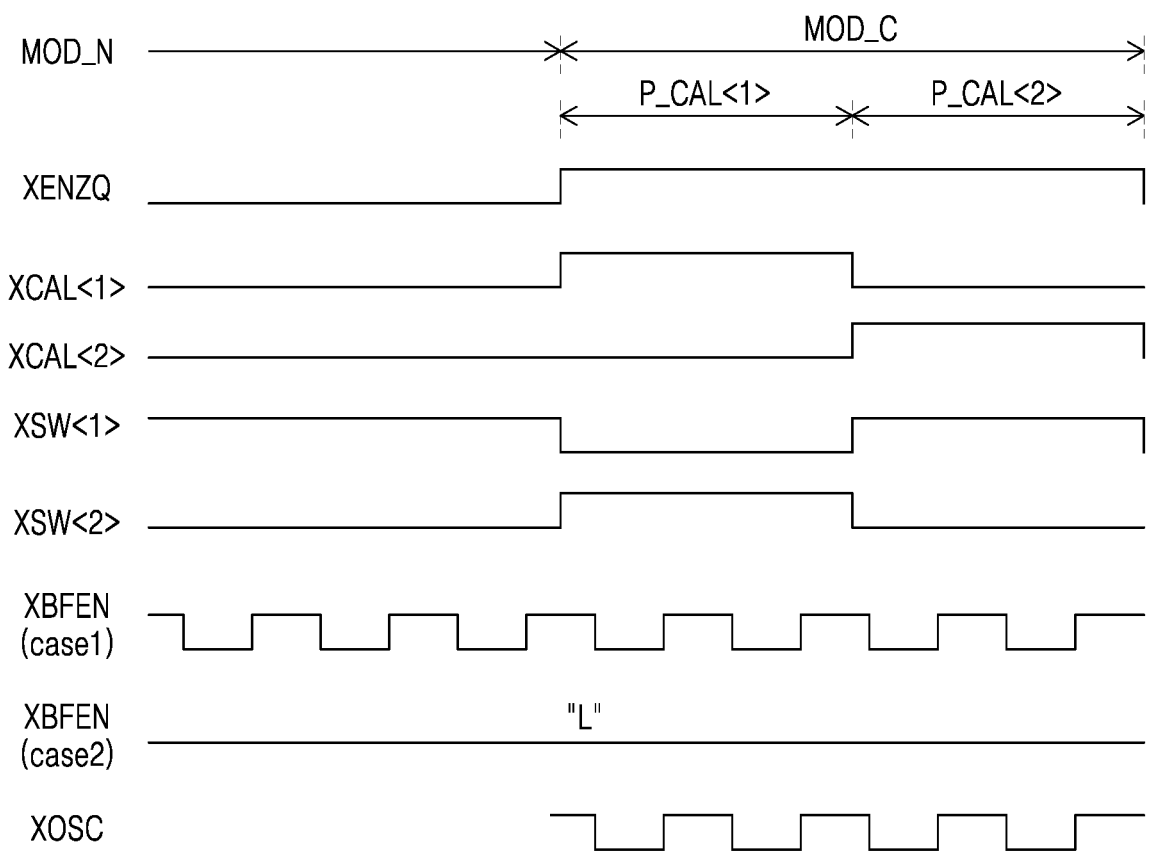
FIG. 2 is a schematic diagram for explaining an operation mode of the signal input buffer of FIG. 1 and main signals related thereto.

Prior to describing the signal input buffer of FIG. 1 in detail, an operation mode of the signal input buffer of the disclosure and related signals will be briefly described with reference to FIG. 2.

The operation mode of the signal input buffer of the first embodiment can be largely divided into a normal mode MOD_N and a calibration mode MOD_C. The calibration mode MOD_C may include a 1-st calibration period P_CAL<1> and a 2-nd calibration period P_CAL<2>.

A calibration enable signal XENZQ may be deactivated to "L" in the normal mode MOD_N, and may be activated to "H" in the calibration mode MOD_C.

A first calibration driving signal XCAL<1> may be activated to "H" in the 1-st calibration period P_CAL<1> of in the calibration mode MOD_C, and a second calibration driving signal XCAL<2> may be activated to "H" in the 2-nd calibration period P_CAL<2> of the calibration mode MOD_C.

A first switching signal XSW<1> may be deactivated to "L" in the 1-st calibration period P_CAL<1> of the calibration mode MOD_C. The first switching signal XSW<1> may be activated to "H" in the 2-nd calibration period P_CAL<2> of the calibration mode MOD_C.

A second switching signal XSW<2> may be deactivated to "L" in the 2-nd calibration period P_CAL<2> of the calibration mode MOD_C. The second switching signal XSW<2> may be activated to "H" in the 1-st calibration period P_CAL<1> of the calibration mode MOD_C.

At least one of the first switching signal XSW<1> and the second switching signal XSW<2> may be activated to "H" in the normal mode MOD_N. In case of FIG. 2, in the normal mode MOD_N, the first switching signal XSW<1> may be activated to "H", and the second switching signal XSW<2> may be deactivated to "L".

A buffer enable signal XBFEN may be in "L", in case it is activated. The buffer enable signal XBFEN may be a pulse signal that is periodically and repeatedly activated in a relatively short period, as case1. Also, the enable signal XBFEN may be a signal that maintains the activation state of "L" in the calibration mode MOD_C, as case2.

An oscillating signal XOSC may be a pulse signal that is periodically and repeatedly activated in the calibration mode MOD_C. The oscillating signal XOSC may be generated inside the semiconductor memory device including the signal input buffer of the disclosure. In case that the buffer enable signal XBFEN is a pulse signal that is periodically and repeatedly activated in a relatively short period, the oscillating signal XOSC may be the buffer enable signal XBFEN.

Referring again to FIG. 1, a control signal generation block BKGC may generate the first calibration driving signal XCAL<1>, the second calibration driving signal XCAL<2>, the first switching signal XSW<1> and the second switching signal XSW<2> with using the calibration enable signal XENZQ.

In this specification, for simplicity of explanation, the detailed description of the configuration and operation of the control signal generation block BKGC is omitted.

Continuously referring again to FIG. 1, the signal input buffer of the first embodiment may comprise a 1-st buffering block BKBF<1>, a 2-nd buffering block BKBF<2>, a 1-st input switching block BKSWI<1>, a 2-nd input switching block BKSWI<2>, a 1-st output switching block BKSWU<1> and a 2-nd output switching block BKSWU<2>.

Each of the 1-st buffering block BKBF<1> and the 2-nd buffering block BKBF<2> may buffer its own input signal pair PXIN, and may generate its own output signal pair PXOU. The input signal pair PXIN may include or consist of an intrinsic input signal XINT and a complementary input signal XINC, and the output signal pair PXOU may include or consist of an intrinsic output signal XOUT and a complementary output signal XOUC.

The 1-st buffering block BKBF<1> may calibrate its own calibration code CDCA in the 1-st calibration period P_CAL<1> of the calibration mode MOD_C, and the 2-nd buffering block BKBF<2> may calibrate its own calibration code CDCA in the 2-nd calibration period P_CAL<2> of the calibration mode MOD_C.

The 1-st input switching block BKSWI<1> may block electrical connection between the reception signal pair PXET and the input signal pair PXIN of the 1-st buffering block BKBF<1> in the 1-st calibration period P_CAL<1>, in which the first switching signal XSW<1> is deactivated as "L". The 1-st input switching block BKSWI<1> may electrically connect the reception signal pair PXET to the input signal pair PXIN of the 1-st buffering block BKBF<1> in the 2-nd calibration period P_CAL<2>, in which the first switching signal XSW<1> is activated to "H".

The 2-nd input switching block BKSWI<2> may block electrical connection between the reception signal pair PXET and the input signal pair PXIN of the 2-nd buffering block BKBF<2> in the 2-nd calibration period P_CAL<2>, in which the second switching signal XSW<2> is deactivated as "L". The 2-nd input switching block BKSWI<2> may electrically connect the reception signal pair PXET to the input signal pair PXIN of the 2-nd buffering block BKBF<2> in the 1-st calibration period P_CAL<1>, in which the second switching signal XSW<2> is activated to "H".

The 1-st output switching block BKSWU<1> may block electrical connection between the output signal pair PXOU of the 1-st buffering block BKBF<1> and the buffered signal pair PDBUF in the 1-st calibration period P_CAL<1>, in which the first switching signal XSW<1> is deactivated as "L". The 1-st output switching block BKSWU<1> may electrically connect the output signal pair PXOU of the 1-st buffering block BKBF<1> to the buffered signal pair PDBUF in the 2-nd calibration period P_CAL<2>, in which the first switching signal XSW<1> is activated to "H".

The 2-nd output switching block BKSWU<2> may block electrical connection between the output signal pair PXOU of the 2-nd buffering block BKBF<2> and the buffered signal pair PDBUF in the 2-nd calibration period P_CAL<2>, in which the second switching signal XSW<2> is deactivated as "L". The 2-nd output switching block BKSWU<2> may electrically connect the output signal pair PXOU of the 2-nd buffering block BKBF<2> to the buffered signal pair PDBUF in the 1-st calibration period P_CAL<1>, in which the second switching signal XSW<2> is activated to "H".

In case of the signal input buffer of this embodiment as described above, in the 1-st calibration period P_CAL<1> in which the calibration code CDCA of the 1-st buffering block BKBF<1> is calibrated, the input signal pair PXIN of the 2-nd buffering block BKBF<2> may be electrically connected to the reception signal pair PXET, and the output signal pair PXOU of the 2-nd buffering block BKBF<2> may be electrically connected to the buffered signal pair PDBUF. The electrical connection between the reception signal pair PXET and the input signal pair PXIN of the 1-st buffering block BKBF<1> may be blocked, and the electrical connection between the output signal pair PXOU of the 1-st buffering block BKBF<1> and the buffered signal pair PDBUF may be blocked.

In the 2-nd calibration period P_CAL<2> in which the calibration code CDCA of the 2-nd buffering block BKBF<2> is calibrated, the input signal pair PXIN of the 1-st buffering block BKBF<1> may be electrically connected to the reception signal pair PXET, and the output signal pair PXOU of the 1-st buffering block BKBF<1> may be electrically connected to the buffered signal pair PDBUF. The electrical connection between the reception signal pair PXET and the input signal pair PXIN of the 2-nd buffering block BKBF<2> may be blocked, and the electrical connection between the output signal pair PXOU of the 2-nd buffering block BKBF<2> and the buffered signal pair PDBUF may be blocked.

For example, while the calibration code CDCA of the 1-st buffering block BKBF<1> is calibrated, the 2-nd buffering block BKBF<2> may buffer the reception signal pair PXET to generate the buffered signal pair PDBUF. While the calibration code CDCA of the 2-nd buffering block BKBF<2> is calibrated, the 1-st buffering block BKBF<1> may buffer the reception signal pair PXET to generate the buffered signal pair PDBUF.

A k-th input switching block may electrically connect the reception signal pair PXET to the input signal pair PXIN of a k-th buffering block in the normal mode MOD_N. Here, 'k' may be at least one of 1 and 2. A k-th output switching block may electrically connect the output signal pair PXOU of the k-th buffering block to the buffered signal PDBUF in the normal mode MOD_N.

In this embodiment, the 1-st input switching block BKSWI<1> may electrically connect the reception signal pair PXET to the input signal pair PXIN of the 1-st buffering block BKBF<1> in the normal mode MOD_N. The 1-st output switching block BKSWU<1> may electrically connect the output signal pair PXOU of the 1-st buffering block BKBF<1> to the buffered signal PDBUF in the normal mode MOD_N.

The 1-st buffering block BKBF<1> and the 2-nd buffering block BKBF<2> may differ only in the signals to be controlled, and may be implemented to have the substantially same or similar configuration and operation.

Therefore, in this specification, only one of the buffering blocks of FIG. 1 is described for simplicity of explanation.

Figure 3:
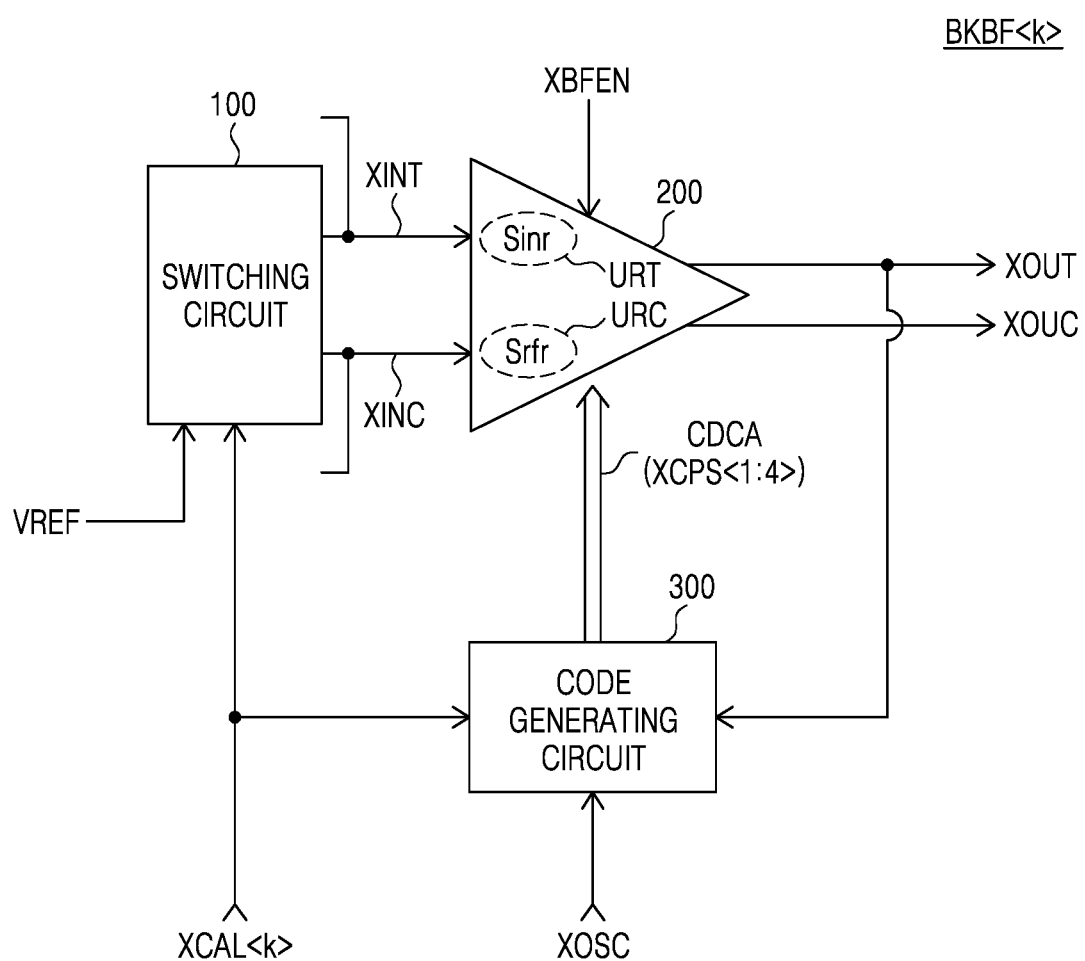
FIG. 3 is a schematic diagram of an equivalent circuit illustrating a k-th buffering block of FIG. 1.

FIG. 3 is a schematic diagram of an equivalent circuit illustrating a k-th buffering block BKBF<k> of FIG. 1. Referring to FIG. 3, the k-th buffering block BKBF<k> may comprise a switching circuit 100, a reception circuit 200 and a code generating circuit 300.

The switching circuit 100 may control the intrinsic input signal XINT and the complementary input signal XINC to the same voltage level, for example, a reference voltage VREF, in a k-th calibration period P_CAL<k> of the calibration mode MOD_C. In the k-th calibration period P_CAL<k>, a k-th calibration driving signal XCAL<k> may be activated as "H".

Figure 4:
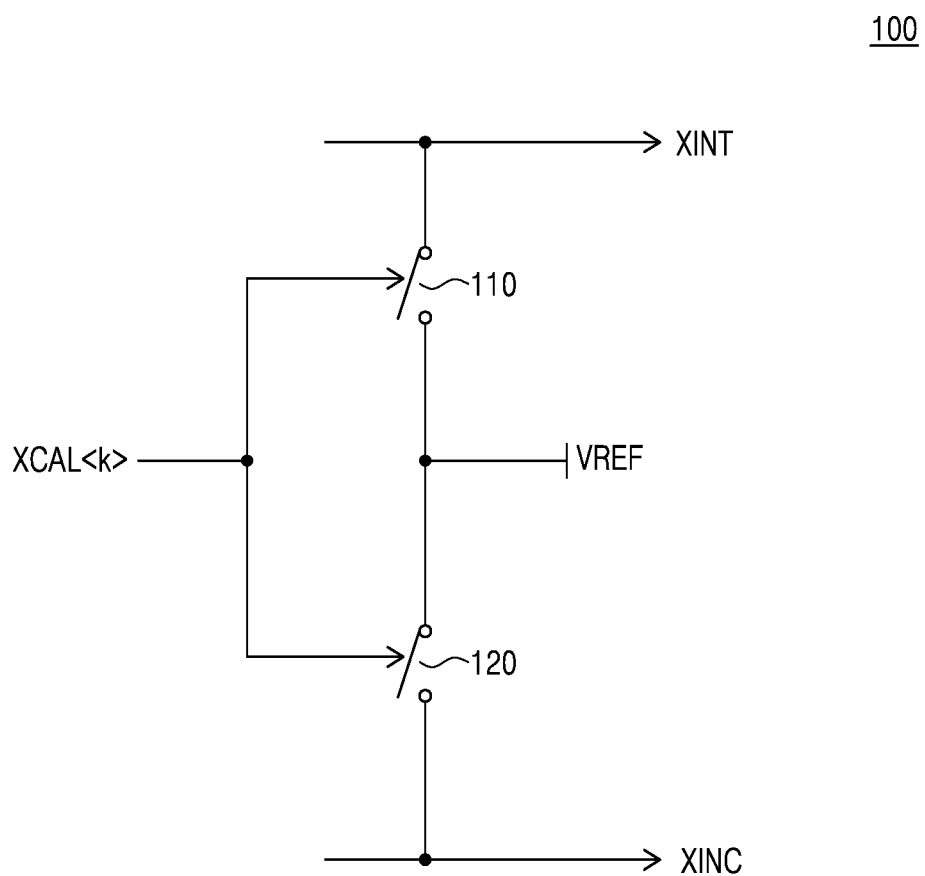
FIG. 4 is a diagram of an equivalent circuit illustrating an example of the switching circuit of FIG. 3.

FIG. 4 is a schematic diagram of an equivalent circuit illustrating an example of the switching circuit 100 of FIG. 3. Referring to FIG. 4, the switching circuit 100 of FIG. 4 may include an intrinsic equalization switch 110 and a complementary equalization switch 120.

The intrinsic equalization switch 110 may be disposed or formed between the intrinsic input signal XINT and the reference voltage VREF, and may be turned-on in response to activation of "H" of the k-th calibration driving signal XCAL<k>. The complementary equalization switch 120 may be disposed or formed between the complementary input signal XINC and the reference voltage VREF, and may be turned-on in response to activation of "H" of the k-th calibration driving signal XCAL<k>.

Referring again to FIG. 3, the reception circuit 200 may be enabled in response to the activation of "L" of the buffer enable signal XBFEN. The reception circuit 200 may include a reception response unit (or reception response part) URT and a comparison response unit (or comparison response part) URC, and may generate the intrinsic output signal XOUT and the complementary output signal XOUC.

The reception response unit URT may have a reception response conductance Sinr, and the comparison response unit URC may have a comparison response conductance Srfr. The reception response conductance Sinr may depend on the voltage of the intrinsic input signal XINT, and the comparison response conductance Srfr may depend on the voltage of the complementary input signal XINC.

In the calibration mode MOD_C, the relative magnitude of the comparison response conductance Srfr with respect to the reception response conductance Sinr may be sequentially changed according to the sequential change of a calibration code CDCA.

The calibration code CDCA may include or consist of n calibration signals XCPS. Here, 'n' may be a natural number equal to or greater than 2. The code value of the calibration code CDCA may correspond to a combination of logic states of the n calibration signals XCPS.

In this embodiment, it is assumed that 'n' is '4' and the calibration code CDCA may include or consist of 1-st to 4-th calibration signals XCPS<1> to XCPS<4>.

Figure 5:
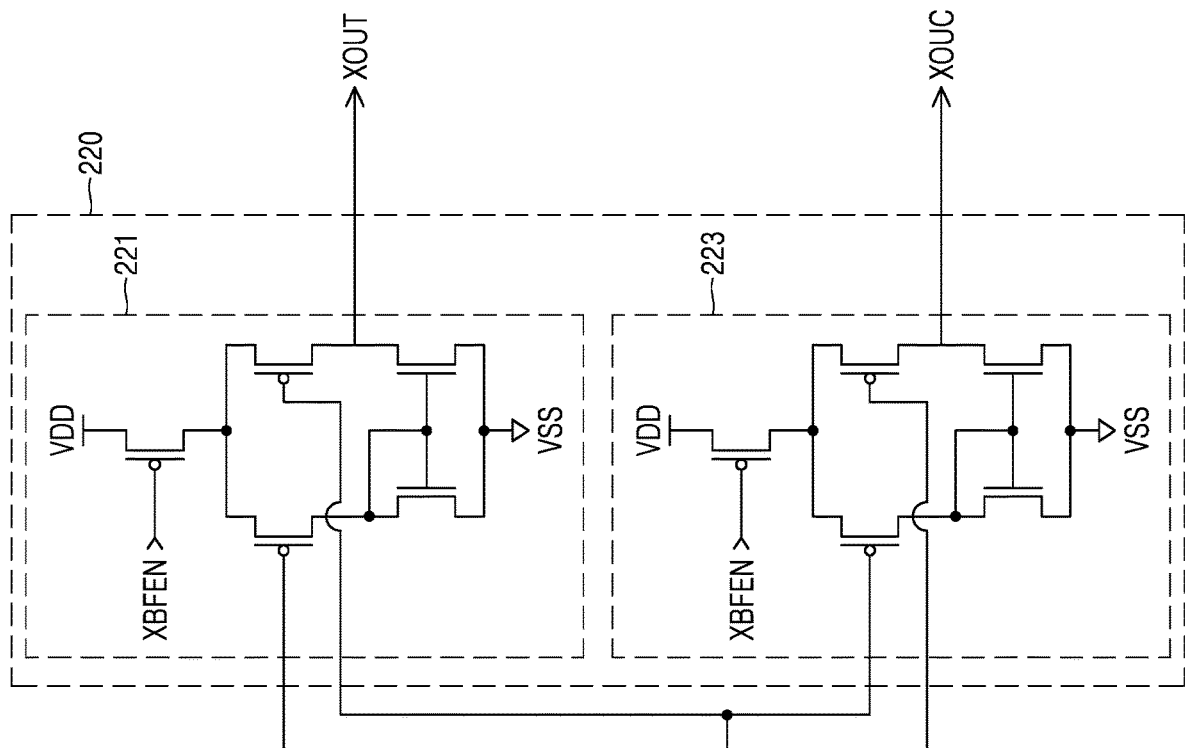
FIG. 5 is a diagram of an equivalent circuit illustrating a reception circuit of FIG. 3.
Figure 5:
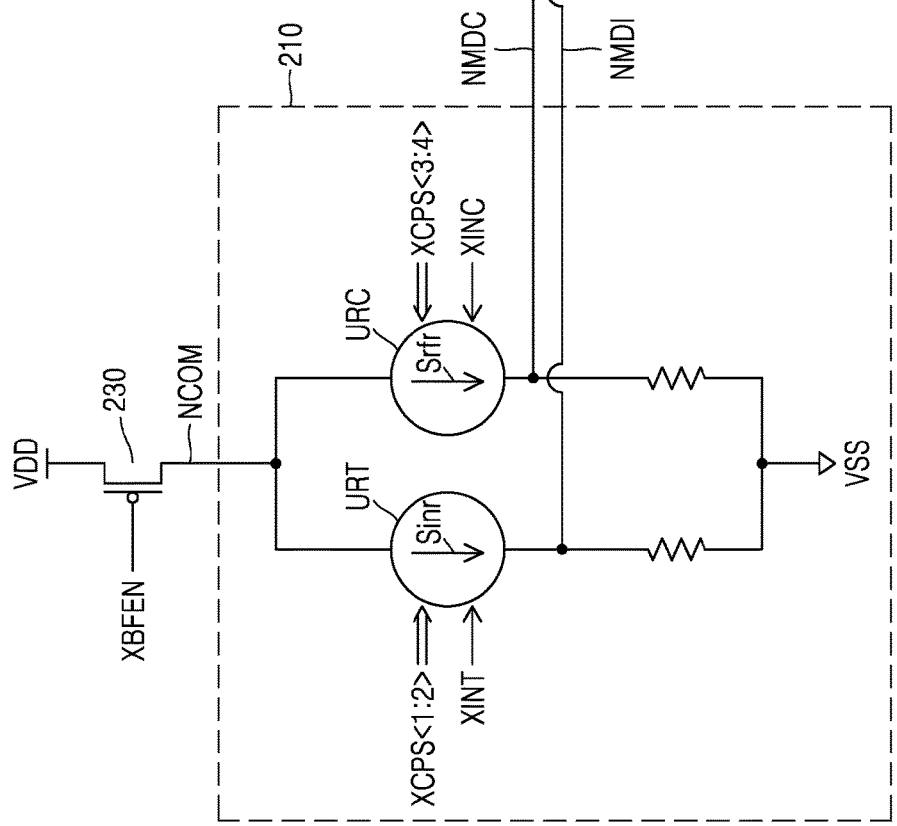

FIG. 5 is a diagram of an equivalent circuit illustrating the reception circuit 200 of FIG. 3. Referring to FIG. 5, the reception circuit 200 may include a reception responding part 210 and a reception amplifying part 220, and may further include an enable transistor 230.

The enable transistor 230 may be a PMOS type transistor, which is disposed or formed between the power voltage VDD and a common node NCOM. The enable transistor 230 may electrically connect the common node NCOM to the power voltage VDD in response to activation of the buffer enable signal XBFEN.

The reception responding part 210 may include the reception response unit URT and the comparison response unit URC. The reception response unit URT may be disposed or formed between the common node NCOM and a reception intermediate node NMDI, and the comparison response unit URC may be disposed or formed between the common node NCOM and a comparison intermediate node NMDC.

Figure 6:
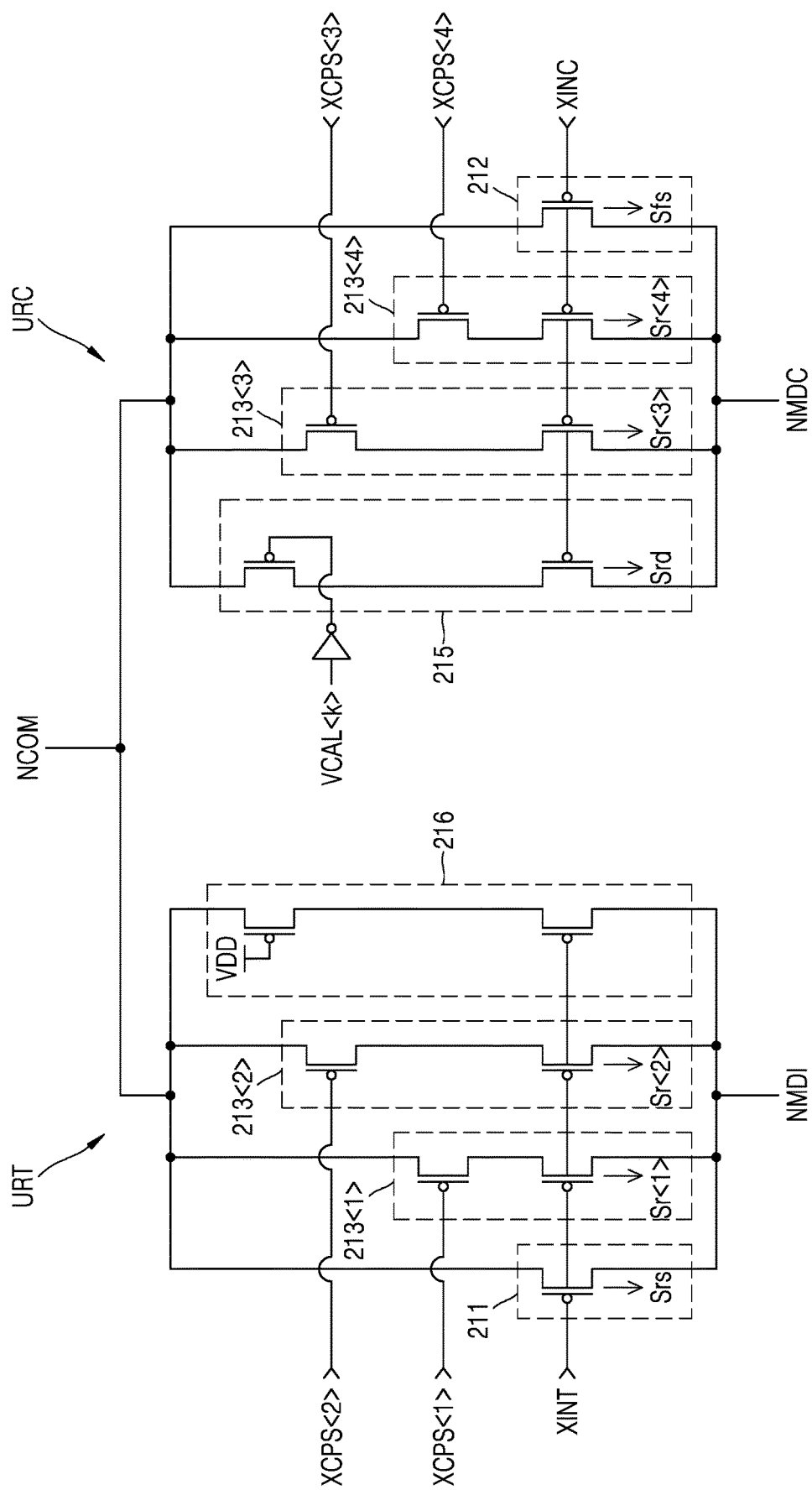
FIG. 6 is a diagram of an equivalent circuit illustrating a reception responding part of FIG. 5.

FIG. 6 is a diagram of an equivalent circuit illustrating the reception responding part 210 of FIG. 5, and specifically shows the reception response unit URT and the comparison response unit URC.

Referring to FIG. 6, the reception response unit URT may include a reception basic means (or reception basic portion) 211 and 1-st to 2-nd response means (or response portions) 213<1> to 213<2>. The reception basic means 211 and the 1-st to the 2-nd response means 213<1> to 213<2> may be disposed or formed in parallel with each other between the common node NCOM and the reception intermediate node NMDI.

The comparison response unit URC may include a comparison basic means 212 and a 3-rd to a 4-th response means 213<3> to 213<4>. The comparison basic means 212 and the 3-rd to the 4-th response means 213<3> to 213<4> may be disposed or formed in parallel with each other between the common node NCOM and the comparison intermediate node NMDC.

The reception basic means 211 may have a reception basic conductance Srs. The reception basic conductance Srs may depend on the voltage of the intrinsic input signal XINT.

The comparison basic means 212 may have a comparison basic conductance Sfs. The comparison basic conductance Sfs may depend on the voltage of the complementary input signal XINC.

The 1-st to 4-th response means 213<1> to 213<4> may be enabled in response to activation of "L" of the 1-st to 4-th calibration signals XCPS<1> to XCPS<4>, respectively. The 1-st to 4-th response means 213<1> to 213<4> may have 1-st to 4-th response conductances SR<1> to SR<4>, respectively.

The 1-st and 2-nd response conductances SR<1> and SR<2> may depend on the voltage of the intrinsic input signal XINT, and the 3-rd and the 4-th response conductances SR<3> and SR<4> may depend on the voltage of the complementary input signal XINC.

The comparison response unit URC may further include a precision response means 215, and the reception response unit URT may further include a compensation response means 216.

The precision response means 215 may be disposed or formed in parallel with the comparison basic means 212 and the 3-rd to 4-th response means 213<3> to 213<4> between the common node NCOM and the comparison intermediate node NMDC. The compensation response means 216 may be disposed or formed in parallel with the reception basic means 211 and the 1-st to 2-nd response means 213<1> to 213<2> between the common node NCOM and the reception intermediate node NMDI.

The precision response means 215 may be enabled in the calibration period P_CAL<k>, in which the k-th calibration driving signal activated as "H". The precision response means 215 may be disabled in the normal mode MOD_N and in the calibration mode MOD_C other than the k-th calibration period P_CAL<k>. The compensation response means 216 may be disabled in both of the calibration mode MOD_C and the normal mode MOD_N.

The precision response means 215 may have a precision conductance Srd. The precision conductance Srd may be a conductance of the precision response means 215 depending on the voltage of the complementary input signal XINC.

In this embodiment, an example of the 1-st to 4-th response conductances Sr<1> to Sr<4> and the precision conductance Srd is shown in (Table1).

TABLE 1

| Conductance type | Conductance amount |
| --- | --- |
| Sr <1> | 2*Su |
| Sr <2> | 1*Su |
| Sr <3> | 1*Su |
| Sr <4> | 2*Su |
| Srd | 0.5*Su |

Here, 'Su' means 'unit conductance'.

As shown in (Table 1), the 1-st to 2-nd response conductances Sr<1> to Sr<2> may be sequentially decreased in the k-th calibration period P_CAL<k>, and the 3-rd to 4-th response conductances Sr<3> to Sr<4> may be sequentially increased in the k-th calibration period P_CAL<k>.

The 1-st response conductance Sr<1> and the 4-th response conductance Sr<4> may be substantially equal to each other. The 2-nd response conductance Sr<2> and the 3-rd response conductance Sr<3> may be substantially equal to each other.

The precision conductance Srd may be smaller than the 2-nd response conductance Sr<2> and the 3-rd response conductance Sr<3>.

In case that the compensation response means 216 of the reception response unit URT is implemented with transistors having the substantially same shape and size as the precision response means 215 of the comparison response unit URC, the occurrence of and offset error due to the provision of the precision response means 215 can be prevented.

In this embodiment, the sum of the reception basic conductance Srs and the 1-st to 2-nd response conductances Sr<1> to Sr<2> may be understood as the reception response conductance Sinr of the reception response unit URT. The sum of the comparison basic conductance Sfs and the 3-rd to 4-th response conductances Sr<3> to Sr<4> may be understood as the comparison response conductance Srfr of the comparison response unit URC.

The reception responding part 210 having the above configuration may be enabled in case that the buffer enable signal XBFEN is activated as "L".

In case that the comparison response conductance Srfr is less than the reception response conductance Sinr, the voltage of the comparison intermediate node NMDC may be lower than that of the reception intermediate node NMDI.

In case that the comparison response conductance Srfr is greater than the reception response conductance Sinr, the voltage of the comparison intermediate node NMDC may be higher than that of the reception intermediate node NMDI.

Referring again to FIG. 5, the reception amplifying part 220 may be electrically connected to the reception intermediate node NMDI and the comparison intermediate node NMDC. The reception amplifying part 220 may generate the intrinsic output signal XOUT and the complementary output signal XOUT.

The reception amplifying part 220 may include a first reception amplifying unit 221 and a second reception amplifying unit 223.

The first reception amplifying unit 221 may be enabled in response to the activation of "L" of the buffer enable signal XBFEN. The first reception amplifying unit 221 may generate the intrinsic output signal XOUT by comparing and buffering voltage levels of the reception intermediate node NMDI and the comparison intermediate node NMDC.

The second reception amplifying unit 223 may be enabled in response to the activation of "L" of the buffer enable signal XBFEN. The second reception amplifying unit 223 may generate the complementary output signal XOUC by comparing and buffering voltage levels of the reception intermediate node NMDI and the comparison intermediate node NMDC.

The intrinsic output signal XOUT and the complementary output signal XOUC may be amplified in opposite directions according to a voltage magnitude relationship between the reception intermediate node NMDI and the comparison intermediate node NMDC.

In this embodiment, in case that the voltage of the comparison intermediate node NMDC is lower than that of the reception intermediate node NMDI, the intrinsic output signal XOUT may be amplified toward the power voltage VDD, and the complementary output signal XOUC may be amplified toward a ground voltage VSS.

In case that the voltage of the comparison intermediate node NMDC is higher than that of the reception intermediate node NMDI, the intrinsic output signal XOUT may be amplified toward the ground voltage VSS, and the complementary output signal XOUC may be amplified toward the power voltage VDD.

For example, in case that the comparison response conductance Srfr is less than the reception response conductance Sinr, the intrinsic output signal XOUT may be amplified toward the power voltage VDD, and the complementary output signal XOUC may be amplified toward a ground voltage VSS.

In case that the comparison response conductance Srfr is greater than the reception response conductance Sinr, the intrinsic output signal XOUT may be amplified toward the ground voltage VSS, and the complementary output signal XOUC may be amplified toward the power voltage VDD.

Referring again to FIG. 3, the code generating circuit 300 may generate a calibration code CDCA. There may be 1-st to 4-th calibration signals XCPS<1> to XCPS<4> in the calibration code CDCA. The 1-st to 4-th calibration signals XCPS<1> to XCPS<4> may be sequentially activated.

Figure 7:
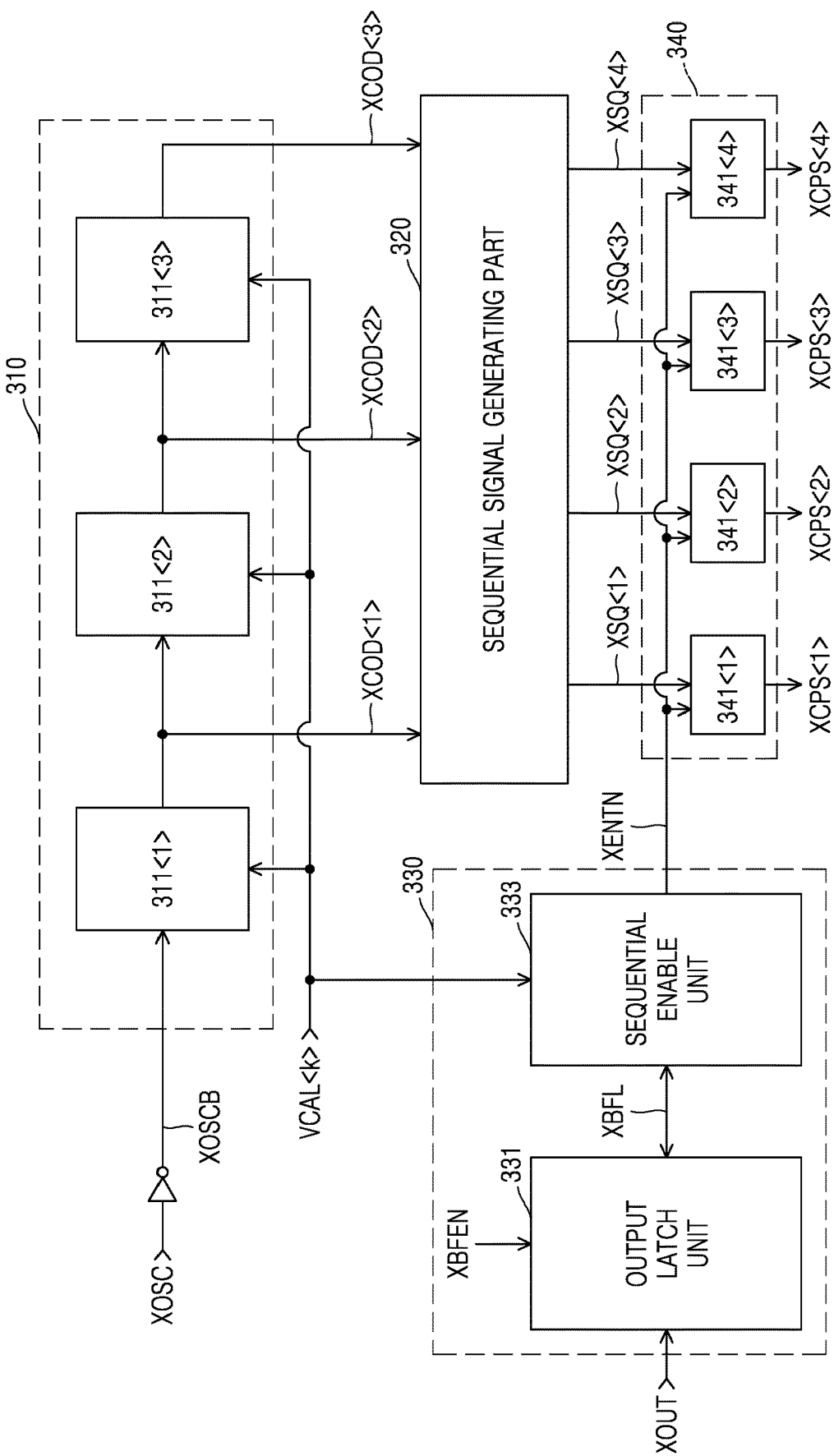
FIG. 7 is a diagram of an equivalent circuit illustrating the code generating circuit of FIG. 3.

FIG. 7 is a diagram illustrating the code generating circuit 300 of FIG. 3. Referring to FIG. 7, the code generating circuit 300 may include a coding generating part 310, a sequential signal generating part 320, a sequential enable generating part 330 and a calibration signal generating part 340.

The coding generating part 310 may generate q coding signal with using the oscillation signal XOSC. Here, 'q' may be a natural number, and the 'n' may be less than or equal to the power of 'q' of '2'. In this embodiment, 'q' is '3'. For example, the coding generating part 310 may benerate 1-st to 3-rd coding signals XCOD<1> to XCOD<3>.

The oscillating signal XOSC may be a pulse signal that is periodically and repeatedly activated in the k-th calibration period P_CAL<k>.

The coding generating part 310 may include 1-st to 3-rd coding generating units (or coding generating parts) 311<1> to 311<3> to generate the 1-st to 3-rd coding signals XCOD<1> to XCOD<3>.

Figure 8:
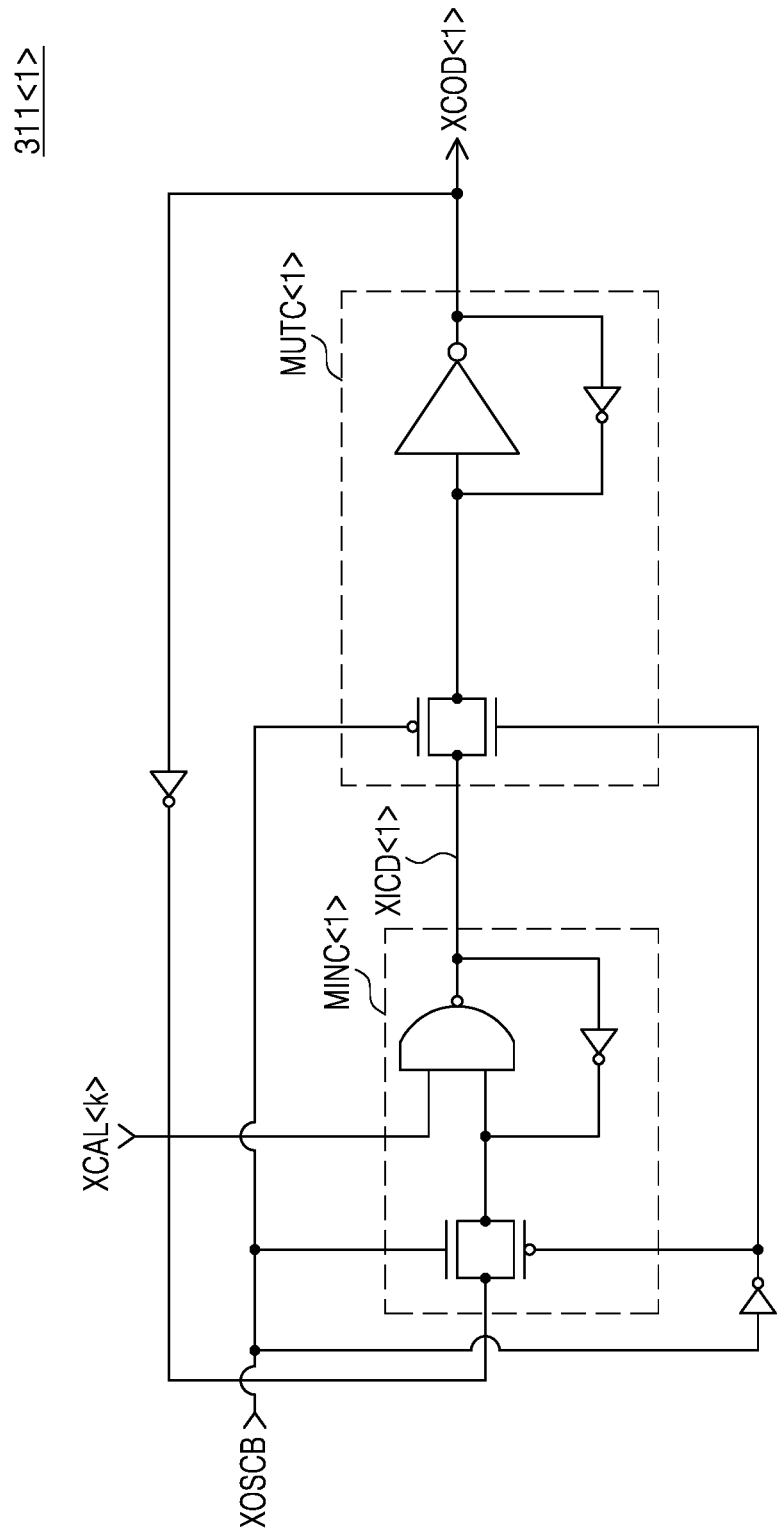
FIG. 8 and FIG. 9 are schematic diagrams of equivalent circuits illustrating coding generating units of FIG. 7.

FIG. 8 is a schematic diagram of an equivalent circuit illustrating the 1-st coding generating unit 311<1> of FIG. 7. Referring to FIG. 8, the 1-st coding generating unit 311<1> may include a 1-st input code means (or input code portions) MINC<1> and a 1-st output code means (or output code portion) MUTC<1>.

The 1-st input code means MINC<1> may receive the inverted signal of the 1-st coding signal XCOD<1>, and may generate a 1-st input code signal XICD<1>. The 1-st input code signal XICD<1> may be controlled to a logic state that is inverted from the inverted signal of the 1-st coding signal XCOD<1> in response to transition to "H" of the inverted signal of the oscillating signal XOSC. The 1-st input code signal XICD<1> may be latched as "H" in response to deactivation of the k-th calibration driving signal XCAL<k>.

In this specification, the logic state of "H" may be referred to as a 'first logic state', and the logic state of "L" may be referred to as a 'second logic state'.

The 1-st output code means MUTC<1> may generate the 1-st coding signal XCOD<1> with inverting the 1-st input code signal XICD<1> in response to the transition to "L" of the inverted signal of the oscillating signal XOSC.

Figure 9:
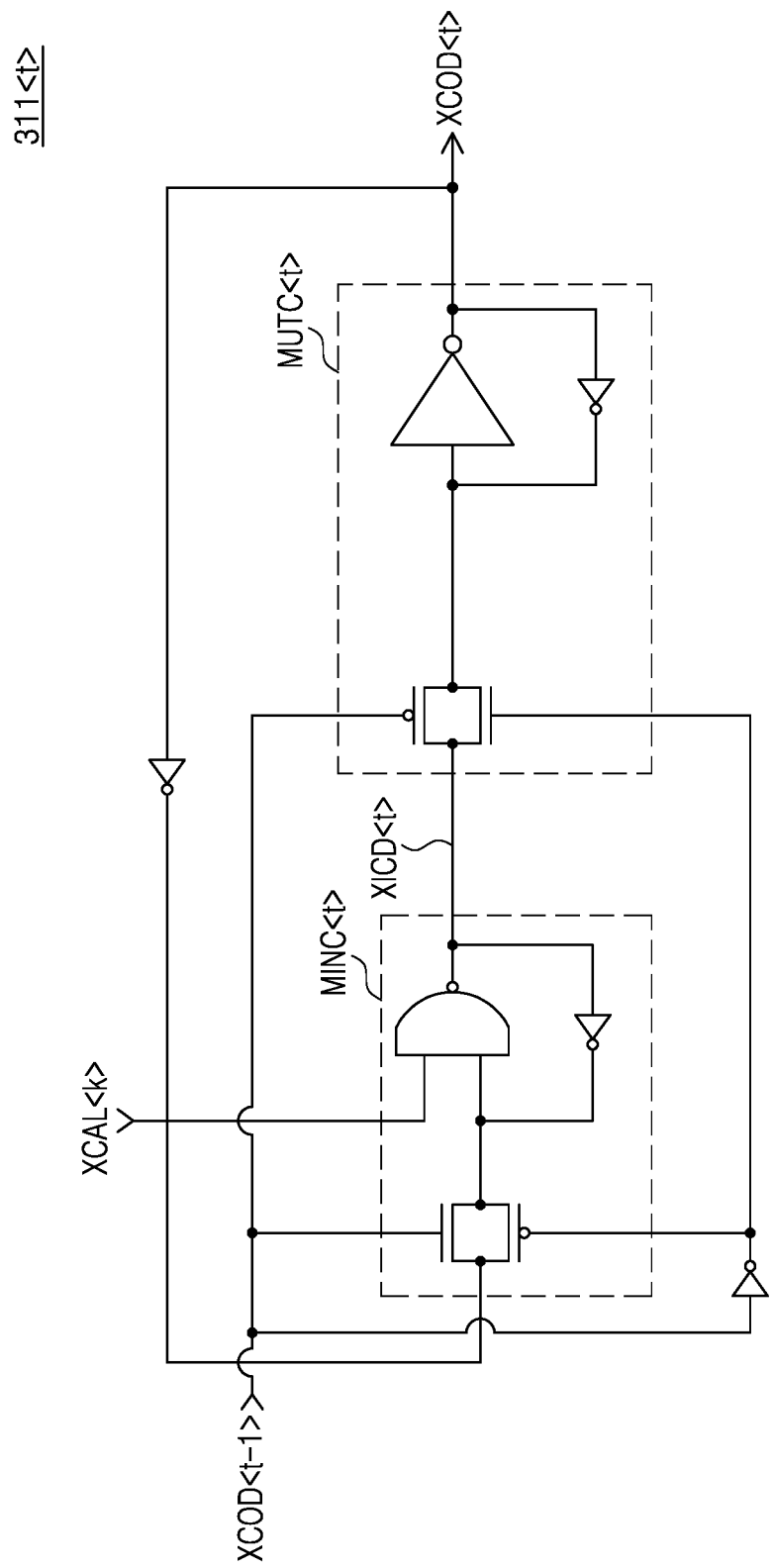

FIG. 9 is a schematic diagram of an equivalent circuit illustrating a t-th coding generating unit 311<t> of FIG. 7. Here, 't' may be a natural number from 2 to 3. Referring to FIG. 9, the t-th coding generating unit 311<t> may include a t-th input code means (or input code portions) MINC<t> and a t-th output code means (or output code portion) MUTC<t>.

The t-th input code means MINC<t> may receive the inverted signal of a t-th coding signal XCOD<t>, and may generate a t-th input code signal XICD<t>. The t-th input code signal XICD<t> may be controlled to a logic state that is inverted from the inverted signal of the t-th coding signal XCOD<t> in response to transition to "H" of an (t−1)-th coding signal XCOD<t−1>. The 1-st input code signal XICD<1> may be latched as "H" in response to deactivation of the k-th calibration driving signal XCAL<k>.

The t-th output code means MUTC<t> may generate the t-th coding signal XCOD<t> with inverting the t-th input code signal XICD<t> in response to transition to "L" of the (t−1)-th coding signal XCOD<t−1>.

Figure 10:
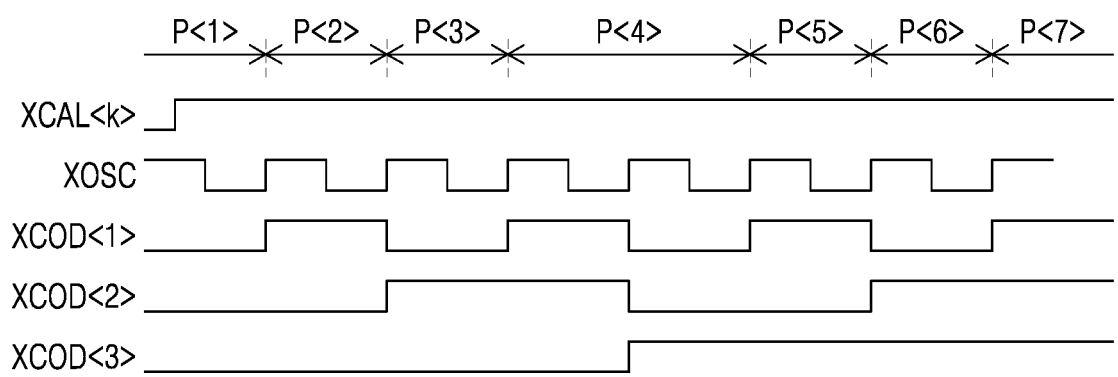
FIG. 10 is a schematic diagram of an equivalent circuit illustrating signals related to a coding generating part of FIG. 7.

In summary, the coding generating part 310 may be enabled according to the activation of "H" of the k-th calibration driving signal XCAL<k>. As shown in FIG. 10, the 1-st coding signal XCOD<1> may alternately rise and fall according to the pulse generation of the oscillating signal XOSC. A 2-nd coding signal XCOD<2> may alternately rise and fall according to the pulse generation of the 1-st coding signal XCOD<1>, and the 3-rd coding signal XCOD<3> may alternately rise and fall according to the pulse generation of the 2-nd coding signal XCOD<2>.

Referring again to FIG. 7, the sequential signal generating part 320 may generate 1-st to 4-th sequential signals XSQ<1> to XSQ<4> with using the 1-st to 3-rd coding signals XCOD<1> to XCOD<3>.

Figure 11:
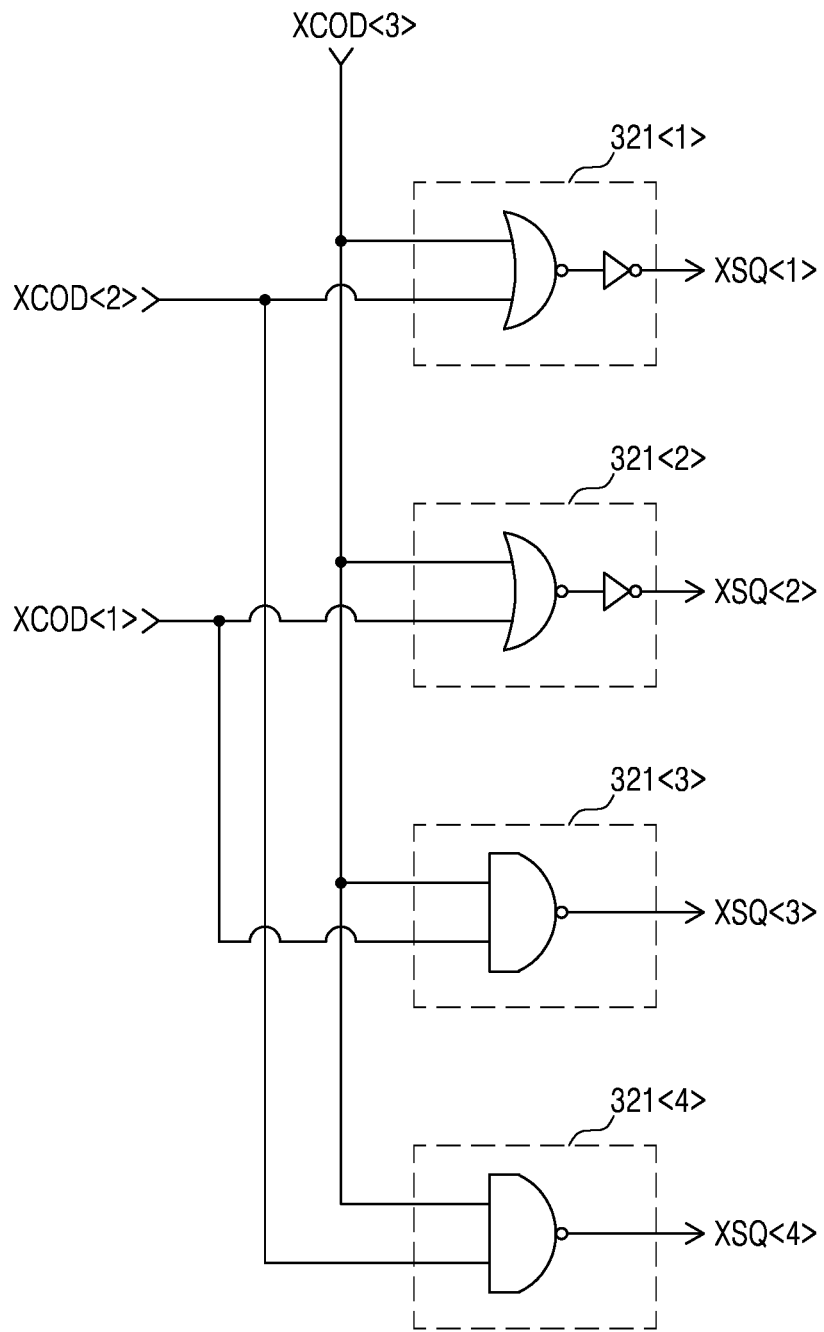
FIG. 11 is a schematic diagram of an equivalent circuit illustrating a sequential signal generating part of FIG. 7.

FIG. 11 is a diagram illustrating the sequential signal generating part 320 of FIG. 7. Referring to FIG. 11, the sequential signal generating part 320 1-st to 4-th sequential generating units (or sequential generating parts) 321<1> to 321<4>.

The 1-st sequential generating unit 321<1> may generate a 1-st sequential signal XSQ<1> with performing an OR operation on the 3-rd coding signal XCOD<3> and the 2-nd coding signal XCOD<2>.

The 2-nd sequential generating unit 321<2> may generate a 2-nd sequential signal XSQ<2> with performing an OR operation on the 3-rd coding signal XCOD<3> and the 1-st coding signal XCOD<1>.

The 3-rd sequential generating unit 321<3> may generate a 3-rd sequential signal XSQ<3> with performing a NAND operation on the 3-rd coding signal XCOD<3> and the 1-st coding signal XCOD<1>.

The 4-th sequential generating unit 321<2> may generate a 4-th sequential signal XSQ<4> with performing a NAND operation on the 3-rd coding signal XCOD<3> and the 2-nd coding signal XCOD<2>.

Figure 12:
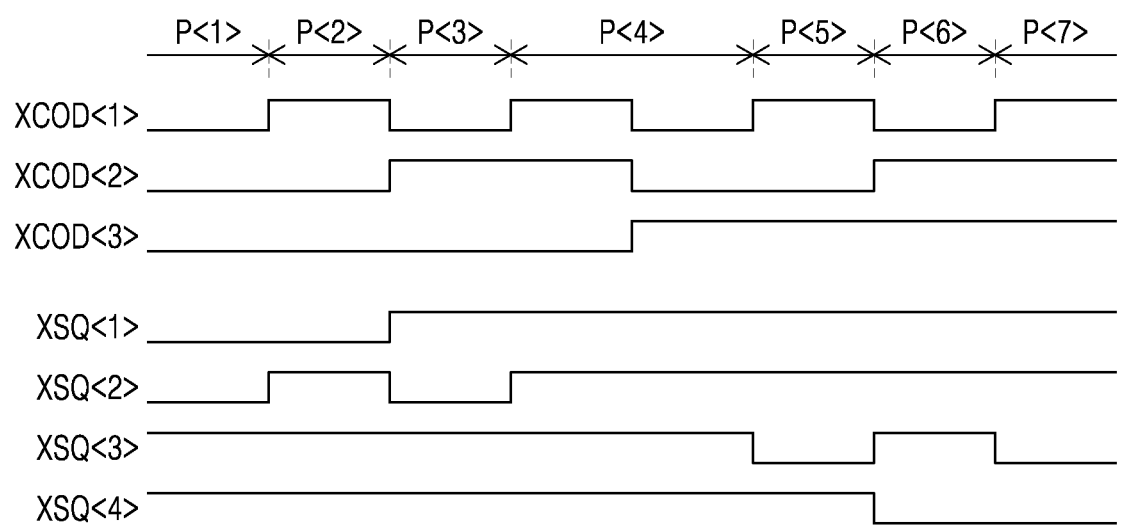
FIG. 12 is a schematic diagram illustrating signals related to a sequential signal generating part of FIG. 11.

According to the sequential signal generating part 320 as described above, as shown in FIG. 12, the 1-st to the 4-th sequential signal XSQ<1> to XSQ<4> are sequentially activated as "L".

Specifically, in the first section P<1>, the 1-st sequential signal XSQ<1> and the 2-nd sequential signal XSQ<2> may be in the activated state of "L", and the 3-rd sequential signal XSQ<3> and the 4-th sequential signal XSQ<3> may be in the inactivated state of "H".

In the second section P<2>, the 1-st sequential signal XSQ<1> may be activated as "L", and the 2-nd to 4-th sequential signals XSQ<2> to XSQ<4> may be deactivated as "H".

In the third section P<3>, the 2-nd sequential signal XSQ<2> may be activated as "L", and the 1-st signal XSQ<1>, the 3-rd to 4-th sequential signals XSQ<3> to XSQ<4> may be deactivated as "H".

In the fourth section P<4>, the 1-st to 4-th sequential signals XSQ<1> to XSQ<4> may be all deactivated as "H".

In the fifth section P<5>, the 3-rd sequential signal XSQ<3> may be activated as "L", and the 1-st to 2-nd sequential signals XSQ<1> to XSQ<2> and the 4-th sequential signal XSQ<4> are deactivated as "H".

In the sixth section P<6>, the 4-th sequential signal XSQ<4> may be activated as "L", and the 1-st to 3-rd sequential signals XSQ<1> to XSQ<3> are deactivated as "H".

In the seven section P<7>, the 3-rd sequential signal XSQ<3> and the 4-th sequential signal XSQ<4> may be activated as "L", and the 1-st sequential signal XSQ<1> and the 2-nd sequential signal XSQ<2> may be deactivated as "H".

Referring again to FIG. 7, the sequential enable generating part 330 may generate a sequential enable signal XENTN.

The sequential enable generating part 330 may include an output latch unit (or output latch part) 331 and a sequential enable generating unit (or sequential enable generating part) 333.

The output latch unit 331 may generate the intrinsic output signal XOUT as an output latch signal XBFL in response to activation of the buffer enable signal XBFEN.

Figure 13:
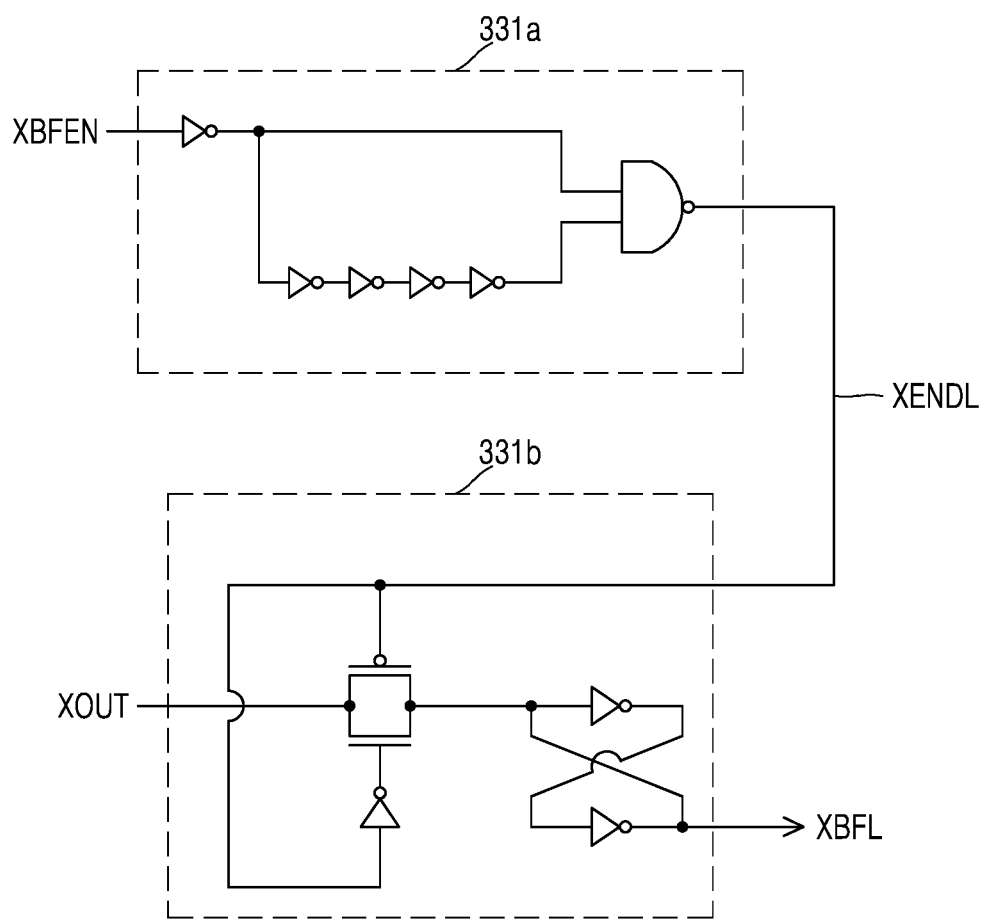
FIG. 13 is a schematic diagram of an equivalent circuit illustrating an output latch unit of FIG. 7.

FIG. 13 is a schematic diagram of an equivalent circuit illustrating the output latch unit 331 of FIG. 7. Referring to FIG. 13, the output latch unit 331 may include a delay enable means (or delay enable portion) 331a and an output latch means (or output latch portion) 331b.

Figure 14:
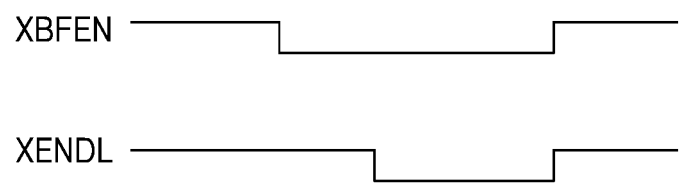
FIG. 14 is a schematic diagram illustrating a delay enable generating means of FIG. 7 and timing of signals related thereto.

The delay enable means 331a may generate a delay enable signal XENDL with using the buffer enable signal XBFEN. The delay enable signal XENDL may be activated to "L" in response to the activation of "L" of the buffer enable signal XBFEN with a delay, as shown in FIG. 14. The delay enable signal XENDL may be deactivated to "H" in response to the deactivation of "H" of the buffer enable signal XBFEN without a delay.

The output latch means 331b may generate the intrinsic output signal XOUT as an output latch signal XBFL in response to activation of the delay enable signal XENDL.

As such, in case that the output latch signal XBFL is generated in response to the delay enable signal XENDL, the logic state of the intrinsic output signal XOUT generated before the stable operation of the reception circuit 200 may be prevented from being reflected in the output latch signal XBFL.

Referring again to FIG. 7, the sequential enable generating unit 333 may receive the output latch signal XBFL, and may generate the sequential enable signal XENTN.

Figure 15:
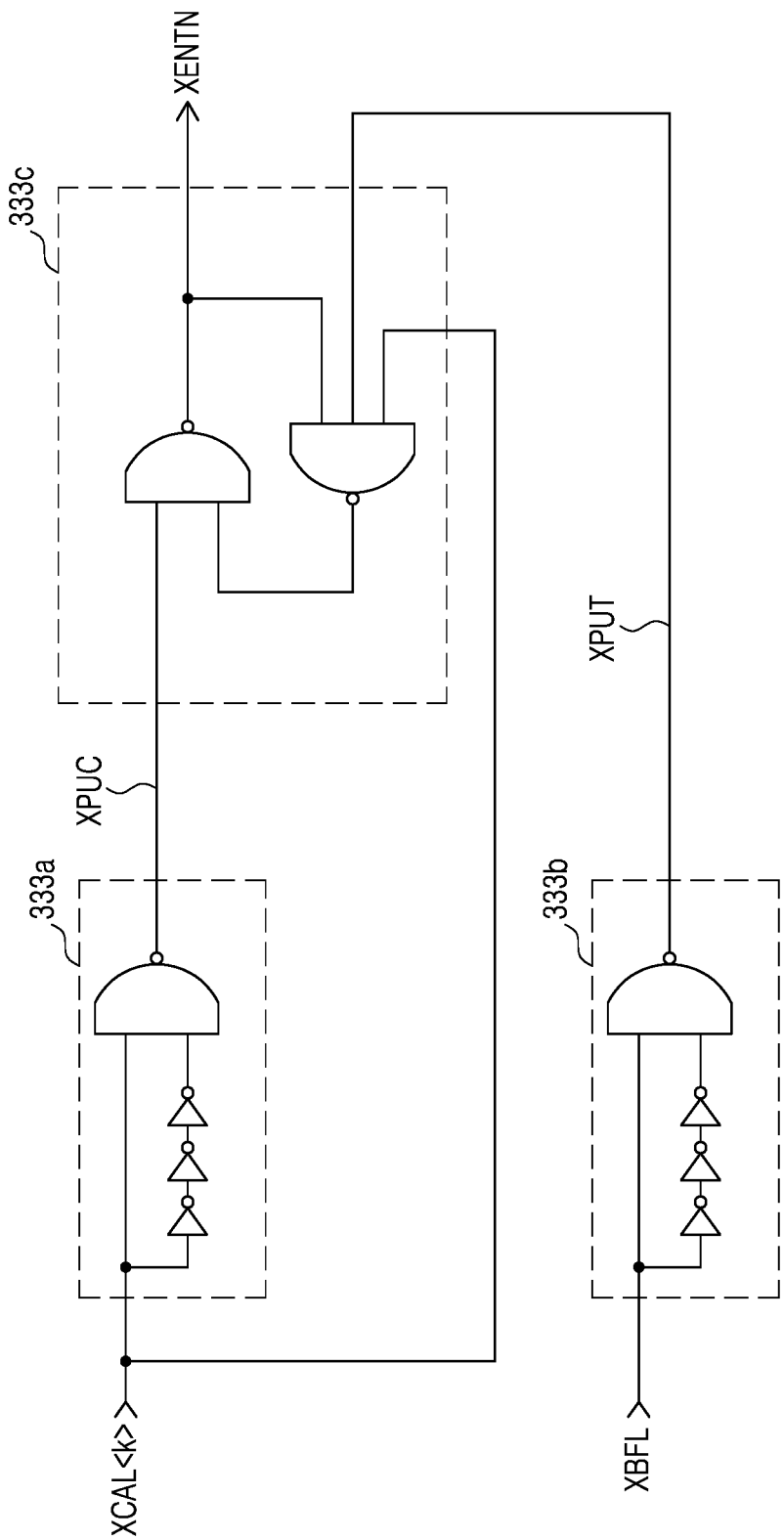
FIG. 15 is a schematic diagram of an equivalent circuit illustrating a sequential enable generating unit of FIG. 7.

FIG. 15 is a schematic diagram of an equivalent circuit illustrating the sequential enable generating unit 333 of FIG. 7. Referring to FIG. 15, the sequential enable generating unit 333 may include a calibration pulse generating means 333a, a transition signal generating means 333b and a sequential enable generating means 333c.

The calibration pulse generating means 333a may generate a calibration pulse XPUC. The calibration pulse XPUC may be activated as "L" in response to activation of "H" of the k-th calibration driving signal XCAL<k>.

The transition signal generating means 333b may generate a transition pulse XPUT. The transition pulse XPUT may be activated as "L" in response to transition from "L" to "H" of the output latch signal XBFL.

The sequential enable generating means 333c may generate the sequential enable signal XENTN. The sequential enable signal XENTN may be activated to "H" in response to a pulse generation of the calibration pulse XPUC, and may be deactivated to "L" in response to a pulse generation of the transition pulse XPUT.

For example, the sequential enable signal XENTN may be activated to "H" in response to activation of "H" of the k-th calibration driving signal XCAL<k>, and the calibration enable signal XENTN may be deactivated to "L" in response to the transition from "L" to "H" of the intrinsic output signal XOUT.

Figure 17:
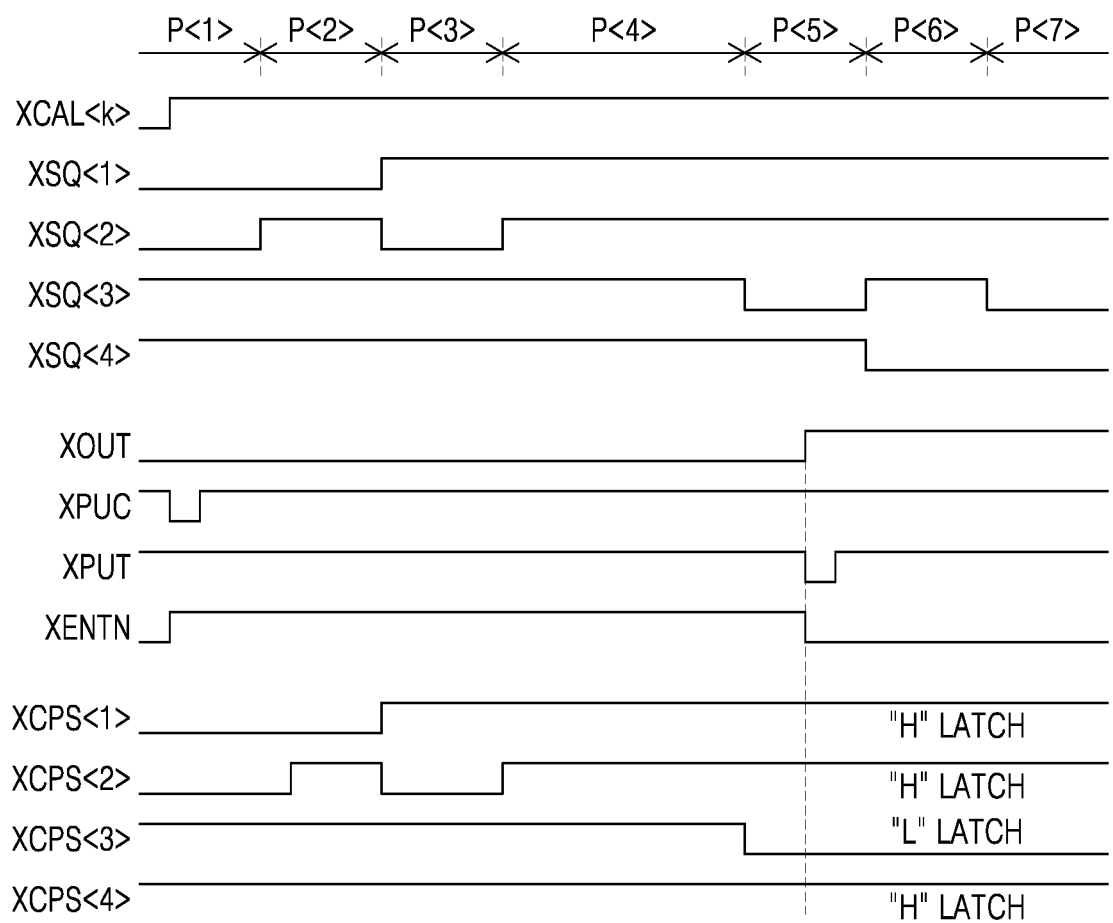
FIG. 17 is a timing diagram for explaining a process in which a calibration code is determined in the signal input buffer of FIG. 1

As a result, the sequential enable signal XENTN, which is generated from the sequential enable generating part 330, may be activated to "H" in response to activation of "H" of the k-th calibration driving signal XCAL<k>, as shown FIG. 17. The calibration enable signal XENTN may be deactivated to "L" in response to the transition from "L" to "H" of the intrinsic output signal XOUT in the k-th calibration period P_CAL<k>.

Referring again to FIG. 7, the calibration signal generating part 340 may generate 1-st to 4-th calibration signals XCPS<1> to XCPS<4> with receiving the 1-st to 4-th sequential signals XSQ<1> to XSQ<4>.

The calibration signal generating part 340 may include 1-st to 4-th calibration generating units (or calibration generating parts) 341<1> to 341<4> to generate the 1-st to 4-th calibration signals XCPS<1> to XCPS<4>.

Figure 16:
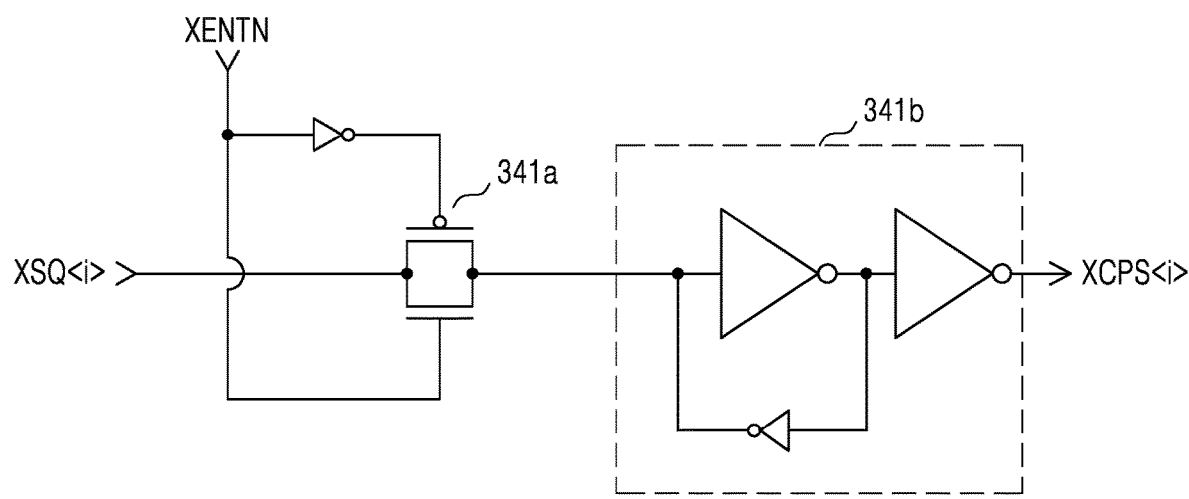
FIG. 16 is a schematic diagram of an equivalent circuit illustrating one of calibration generating units of FIG. 7

FIG. 16 is a schematic diagram of an equivalent circuit illustrating one of calibration generating units 341 of FIG. 7, and shows an i-th calibration generating unit 341<i>.

Referring to FIG. 16, the i-th calibration generating unit 341<i> may include a calibration switch 341a and a calibration latch means 341b.

The calibration switch 341a may transmit the i-th sequential signal XSQ<i> to the calibration latch means 341b in case that the sequential enable signal is activated as "H".

The calibration latch means 341b may generate an i-th calibration signal XCPS<i>. The logic state of the i-th calibration signal XCPS<i> may correspond to the logic state of the i-th sequential signal XSQ<i>, which is transmitted through the calibration switch 341a. The logic state of the i-th calibration signal XSQ<i> may be latched according to deactivation of "L" of the sequential enable signal XENTN.

For example, while the sequential enable signal XENTN is activated, the logic state of the i-th calibration signal XCPS<i> may be the same as that of the i-th sequential signal XSQ<i>. The logic state of the i-th calibration signal XSQ<i> may be latched according to deactivation of "L" of the sequential enable signal XENTN.

As a result, according to the code generating circuit 300, as can be seen from FIG. 17, the calibration code CDCA may be sequentially changed in the k-th calibration period P_CAL<k>, and may be latched in response to the transition from "L" to "H" of the intrinsic output signal XOUT.

Next, an offset calibration process in the signal input buffer of the disclosure will be described.

First, the change in the logic state of the calibration signals XCPS for each section and the relative magnitudes between the reception response conductance Sinr and the comparison response conductance Srfr are as shown in (Table 2).

Here, it is understood that the change in the logic state of the calibration signals XCPS for each section means the sequential change of the calibration code CDCA for each section.

TABLE 2

| section | XCPS <1> | XCPS <2> | XCPS <3> | XCPS <4> | Relative magnitude of Conductance |
|---|---|---|---|---|---|
| P <1> | L | L | H | H | (−) 2.5*Sun |
| P <2> | L | H | H | H | (−) 1.5*Sun |
| P <3> | H | L | H | H | (−) 0.5*Sun |
| P <4> | H | H | L | H | (+) 0.5*Sun |
| P <5> | H | H | L | H | (+) 1.5*Sun |
| P <6> | H | H | H | L | (+) 2.5*Sun |
| P <7> | H | H | L | L | (+) 3.5*Sun |

Here, a sign (−) means that the reception response conductance Sinr is greater than the comparison response conductance Srfr, and a sign (+) means that the comparison response conductance Srfr is greater than the reception response conductance Sinr.

As can be seen from (Table 2), in the signal input buffer of the disclosure, the relative magnitude of the comparison response conductance Srfr with respect to the reception response conductance Sinr is sequentially changed according to the sequential change of the calibration code CDCA, in the calibration mode MOD_C.

In FIG. 17, it is assumed that the buffered signal DBUF transitions from "L" to "H" in a fifth section P<5>.

In this case, by the 1-st to 4-th calibration generating units 341<1> to 341<4>, the logic states of the 1-st to 4-th calibration signals XCPS<1> to XCPS<4> in the fifth section P<5> may be latched.

Subsequently, the effect of the precision response means 215 having the precision conductance Srd in the signal input buffer of the disclosure will be examined.

First, it is assumed that the signal input buffer of the disclosure does not include the precision response means 215.

In this case, in the normal mode MOD_N, the maximum difference between the reception response conductance Sinr and the comparison response conductance Srfr may be 1*Sun.

However, in case of the signal input buffer of the disclosure, in the normal mode MOD_N in which the precision response means 215 is disabled, the maximum difference between the reception response conductance Sinr and the comparison response conductance Srfr may be decreased to 0.5*Sun.

For example, by the precision response means 215 having the precision conductance Srd, the error in the offset calibration in the signal input buffer of the disclosure can be reduced.

In summary, in the signal input buffer of the first embodiment, the intrinsic input signal XINT and the complementary input signal XINC may be controlled as the level of the reference voltage VREF. Accordingly, the voltage of the intrinsic input signal XINT induced to the reception response unit URT and the voltage of the complementary input signal XINC induced to the comparison response unit URC may be at the same level.

The calibration code CDCA may be sequentially changed, and the transition of the intrinsic output signal XOUT may be monitored. At the transition point from "L" to "H" of the intrinsic output signal XOUT, the calibration code CDCA may be stored, and thereby the offset may be calibrated.

According to the signal input buffer of the disclosure, the time required for offset calibration may be significantly reduced.

For example, according to the signal input buffer of the disclosure, the offset can be calibrated very effectively.

The signal input buffer of the disclosure may be modified in various forms.

Second Embodiment

Figure 18:
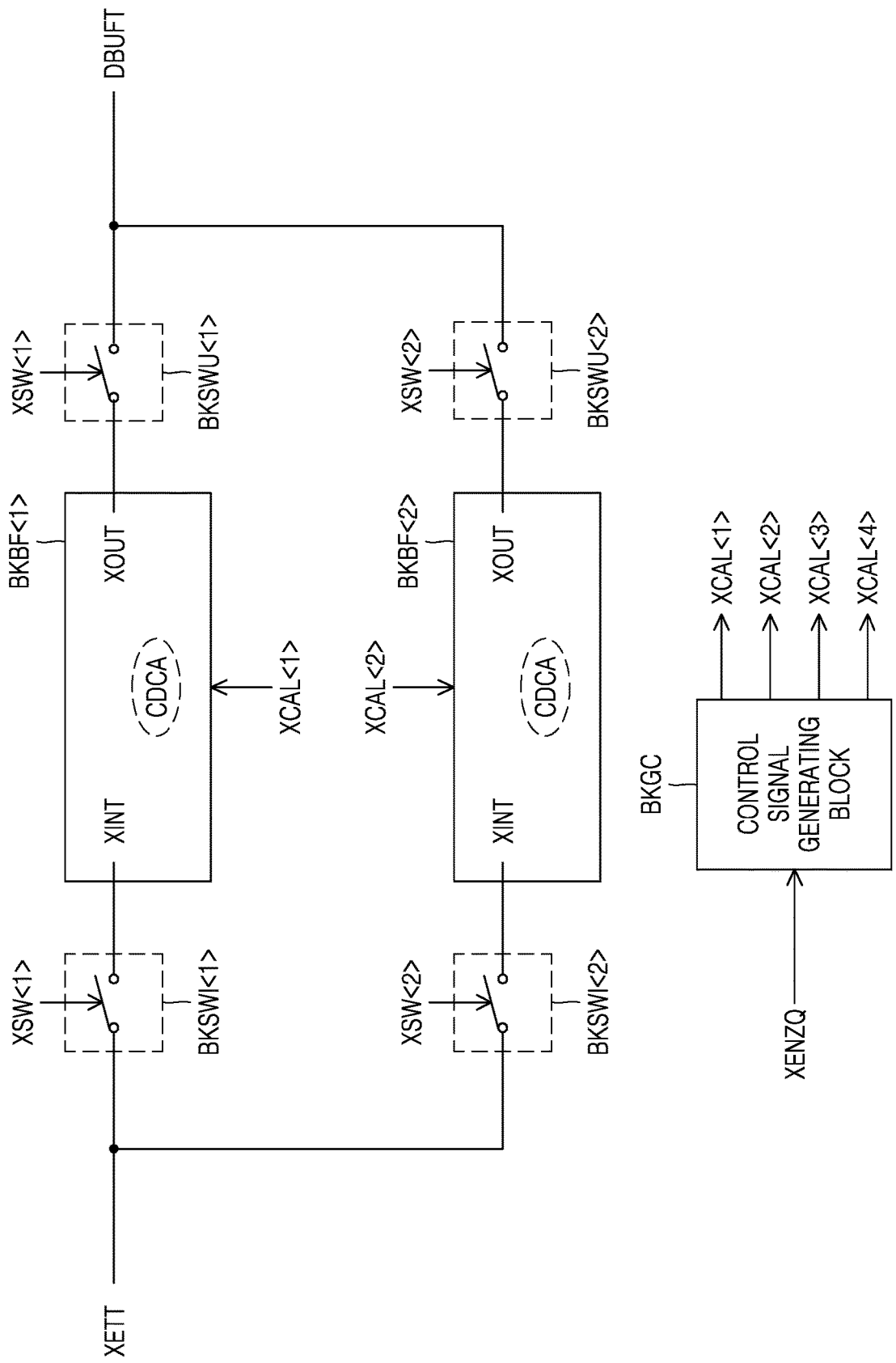
FIG. 18 is a diagram illustrating the signal input buffer according to a second embodiment of the disclosure.

FIG. 18 is a diagram illustrating the signal input buffer according to a second embodiment of the disclosure.

The signal input buffer of the second embodiment of the disclosure shown in FIG. 18 may buffer an intrinsic reception signal XINT and may generate an intrinsic buffered signal DBUFT. The intrinsic reception signal XINT may be an analog type, and the intrinsic buffered signal DBUFT may be a digital type.

Figure 19:
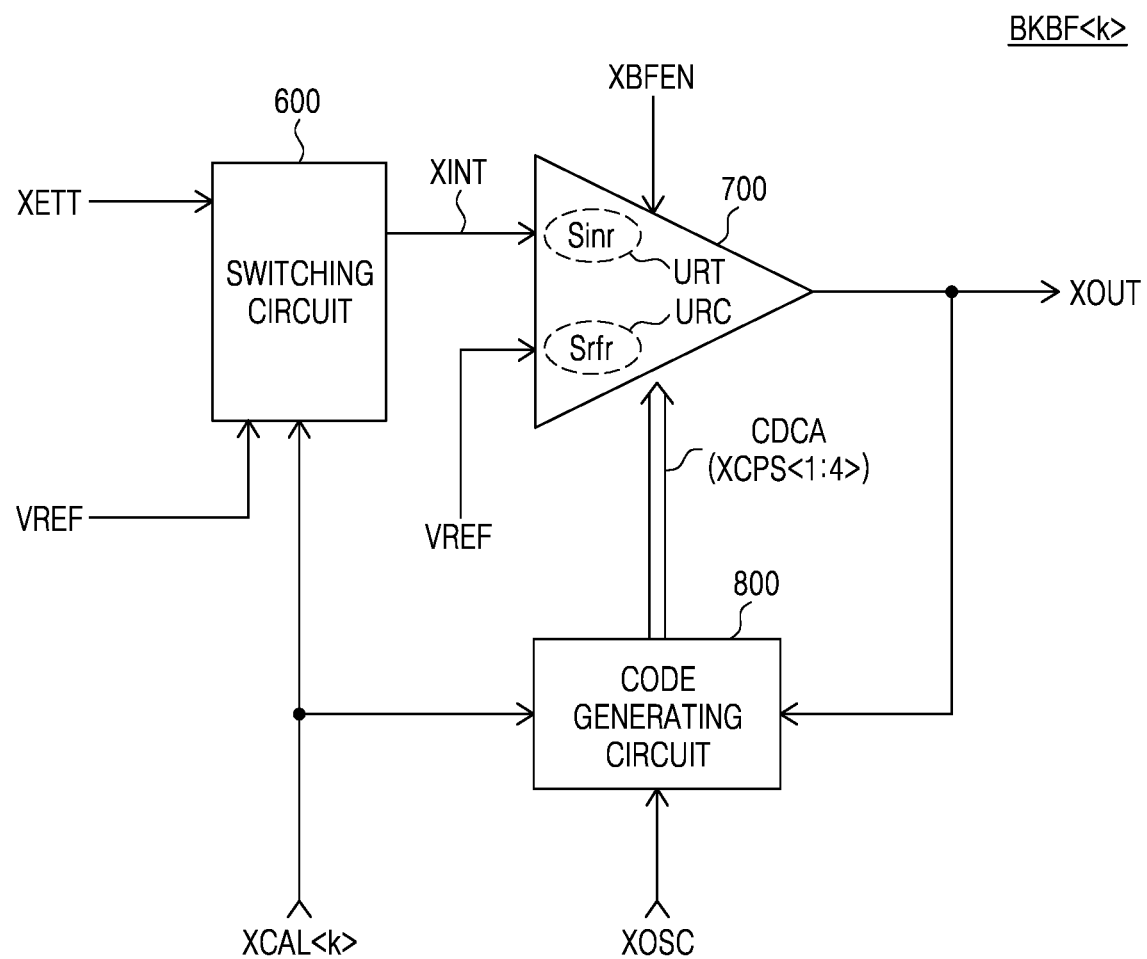
FIG. 19 is a schematic diagram illustrating a k-th buffering block of FIG. 18.

The operation mode of the signal input buffer of FIG. 19 and main signals related thereto may be similar to an operation mode of the signal input buffer of FIG. 1 and main signals related thereto. Therefore, a detailed description thereof will be omitted.

In the signal input buffer of FIG. 18, a control signal generation block BKGC may generate the first calibration driving signal XCAL<1>, the second calibration driving signal XCAL<2>, the first switching signal XSW<1> and the second switching signal XSW<2> with using the calibration enable signal XENZQ, similar to the signal input buffer of FIG. 1.

Referring to FIG. 18, the signal input buffer of the second embodiment may comprise a 1-st buffering block BKBF<1>, a 2-nd buffering block BKBF<2>, a 1-st input switching block BKSWI<1>, a 2-nd input switching block BKSWI<2>, a 1-st output switching block BKSWU<1> and a 2-nd output switching block BKSWU<2>.

Each of the 1-st buffering block BKBF<1> and the 2-nd buffering block BKBF<2> may buffer its own intrinsic input signal XINT, and generate its own intrinsic output signal XOUT.

The 1-st buffering block BKBF<1> may calibrate its own calibration code CDCA in the 1-st calibration period P_CAL<1> of the calibration mode MOD_C, and the 2-nd buffering block BKBF<2> may calibrate its own calibration code CDCA in the 2-nd calibration period P_CAL<2> of the calibration mode MOD_C.

The 1-st input switching block BKSWI<1> may block electrical connection between the intrinsic reception signal XETT and the intrinsic input signal XINT of the 1-st buffering block BKBF<1> in the 1-st calibration period P_CAL<1>, in which the first switching signal XSW<1> is deactivated as "L". The 1-st input switching block BKSWI<1> may electrically connect the intrinsic reception signal XETT to the intrinsic input signal PXINT of the 1-st buffering block BKBF<1> in the 2-nd calibration period P_CAL<2>, in which the first switching signal XSW<1> is activated to "H".

The 2-nd input switching block BKSWI<2> may block electrical connection between the intrinsic reception signal XETT and the intrinsic input signal XINT of the 2-nd buffering block BKBF<2> in the 2-nd calibration period P_CAL<2>, in which the second switching signal XSW<2> is deactivated as "L". The 2-nd input switching block BKSWI<2> may electrically connect the intrinsic reception signal XETT to the intrinsic input signal XINT of the 2-nd buffering block BKBF<2> in the 1-st calibration period P_CAL<1>, in which the second switching signal XSW<2> is activated to "H".

The 1-st output switching block BKSWU<1> may block electrical connection between the intrinsic output signal XOUT of the 1-st buffering block BKBF<1> and the intrinsic buffered signal DBUFT in the 1-st calibration period P_CAL<1>, in which the first switching signal XSW<1> is deactivated as "L". The 1-st output switching block BKSWU<1> may electrically connect the intrinsic output signal XOUT of the 1-st buffering block BKBF<1> to the intrinsic buffered signal DBUFT in the 2-nd calibration period P_CAL<2>, in which the first switching signal XSW<1> is activated to "H".

The 2-nd output switching block BKSWU<2> may block electrical connection between the intrinsic output signal XOUT of the 2-nd buffering block BKBF<2> and the intrinsic buffered signal DBUFT in the 2-nd calibration period P_CAL<2>, in which the second switching signal XSW<2> is deactivated as "L". The 2-nd output switching block BKSWU<2> may electrically connect the intrinsic output signal XOUT of the 2-nd buffering block BKBF<2> to the intrinsic buffered signal DBUFT in the 1-st calibration period P_CAL<1>, in which the second switching signal XSW<2> is activated to "H".

In case of the signal input buffer of this embodiment as described above, in the 1-st calibration period P_CAL<1> in which the calibration code CDCA of the 1-st buffering block BKBF<1> may be calibrated, the intrinsic input signal XINT of the 2-nd buffering block BKBF<2> may be electrically connected to the intrinsic reception signal XETT, and the intrinsic output signal XOUT of the 2-nd buffering block BKBF<2> may be electrically connected to the intrinsic buffered signal DBUFT. The electrical connection between the intrinsic reception signal XETT and the intrinsic input signal XINT of the 1-st buffering block BKBF<1> may be blocked, and the electrical connection between the intrinsic output signal XOUT of the 1-st buffering block BKBF<1> and the intrinsic buffered signal DBUFT is blocked.

In the 2-nd calibration period P_CAL<2> in which the calibration code CDCA of the 2-nd buffering block BKBF<2> is calibrated, the intrinsic input signal XINT of the 1-st buffering block BKBF<1> may be connected to the intrinsic reception signal XETT, and the intrinsic output signal XOUT of the 1-st buffering block BKBF<1> may be electrically connected to the intrinsic buffered signal DBUFT. The electrical connection between the intrinsic reception signal XETT and the intrinsic input signal XINT of the 2-nd buffering block BKBF<2> may be blocked, and the electrical connection between the intrinsic output signal XOUT of the 2-nd buffering block BKBF<2> and the intrinsic buffered signal DBUFT may be blocked.

For example, while the calibration code CDCA of the 1-st buffering block BKBF<1> is calibrated, the 2-nd buffering block BKBF<2> may buffer the intrinsic reception signal XETT to generate the intrinsic buffered signal DBUFT. While the calibration code CDCA of the 2-nd buffering block BKBF<2> is calibrated, the 1-st buffering block BKBF<1> may buffer the intrinsic reception signal XETT to generate the intrinsic buffered signal DBUFT.

A k-th input switching block may electrically connect the intrinsic reception signal XETT to the intrinsic input signal XINT of a k-th buffering block in the normal mode MOD_N. Here, 'k' may be at least one of 1 and 2. A k-th output switching block may electrically connect the intrinsic output signal XOUT of the k-th buffering block to the intrinsic buffered signal DBUFT in the normal mode MOD_N.

In this embodiment, the 1-st input switching block BKSWI<1> may electrically connect the intrinsic reception signal XETT to the intrinsic input signal XINT of the 1-st buffering block BKBF<1> in the normal mode MOD_N. The 1-st output switching block BKSWU<1> may electrically connect the intrinsic output signal XOUT of the 1-st buffering block BKBF<1> to the intrinsic buffered signal DBUFT in the normal mode MOD_N.

Meanwhile, the 1-st buffering block BKBF<1> and the 2-nd buffering block BKBF<2> may differ only in the signals to be controlled, and may be implemented to have the same configuration and operation.

FIG. 19 is a schematic diagram of an equivalent circuit illustrating a k-th buffering block BKBF<k> of FIG. 18. Referring to FIG. 19, the k-th buffering block BKBF<k> may comprise a switching circuit 600, a reception circuit 700 and a code generating circuit 800.

The switching circuit 600 may control the intrinsic input signal XINT to a reference voltage VREF, in a k-th calibration period P_CAL<k> of the calibration mode MOD_C. In the k-th calibration period P_CAL<k>, a k-th calibration driving signal XCAL<k> may be activated as "H".

The reception circuit 700 may be enabled in response to the activation of "L" of the buffer enable signal XBFEN. The reception circuit 700 may include a reception response unit (or reception response part) URT and a comparison response unit (or comparison response part) URC, and may generate the intrinsic output signal XOUT.

The reception response unit URT may have a reception response conductance Sinr, and the comparison response unit URC may have a comparison response conductance Srfr. Here, the reception response conductance Sinr may depend on the voltage of the intrinsic input signal XINT, and the comparison response conductance Srfr may depend on the level of the reference voltage VREF.

In the calibration mode MOD_C, the relative magnitude of the comparison response conductance Srfr with respect to the reception response conductance Sinr may be sequentially changed according to the sequential change of a calibration code CDCA.

The calibration code CDCA may include or consist of n calibration signals XCPS. Here, 'n' may be a natural number equal to or greater than 2. The code value of the calibration code CDCA may correspond to a combination of logic states of the n calibration signals XCPS.

In this embodiment, it is assumed that 'n' is '4' and the calibration code CDCA may include or consist of a 1-st to 4-th calibration signals XCPS<1> to XCPS<4>.

Figure 20:
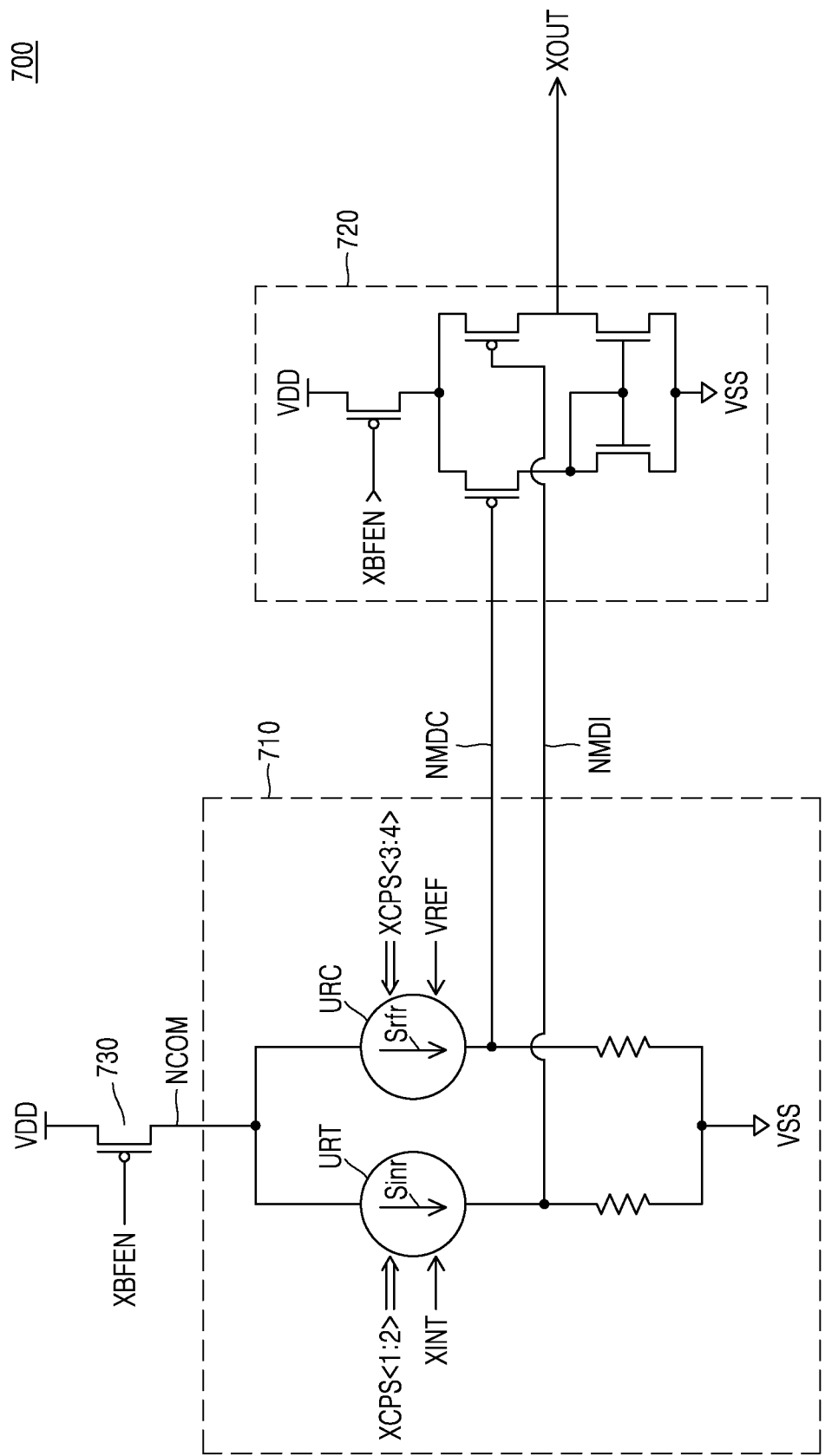
FIG. 20 is a diagram of an equivalent circuit illustrating a reception circuit of FIG. 19.

FIG. 20 is a diagram of an equivalent circuit illustrating the reception circuit 700 of FIG. 19. Referring to FIG. 20, the reception circuit 700 may include a reception responding part 710 and a reception amplifying part 720, and may further include an enable transistor 730.

The enable transistor 730 may have the substantially same configuration as the enable transistor 230 of FIG. 5. Therefore, in this specification, a detailed description thereof omitted.

The reception response part 710 may be the substantially same as or similar to the reception response part 210 of FIG. 5, except that the reference voltage VREF may be induced instead of the complementary input signal XINC of FIG. 5. Therefore, in this specification, a detailed description thereof omitted.

The reception amplifying part 720 may be enabled in response to the activation of "L" of the buffer enable signal XBFEN. The reception amplifying part 720 may amplify the voltage difference between the reception intermediate node NMDI and the comparison intermediate node NMDC, and may generate the intrinsic output signal XOUT.

According to the reception circuit 700 of FIG. 20, in case that the comparison response conductance Srfr is less than the reception response conductance Sinr, the intrinsic output signal XOUT may be amplified toward the power voltage VDD.

In case that the comparison response conductance Srfr is greater than the reception response conductance Sinr, the intrinsic output signal XOUT may be amplified toward the ground voltage VSS.

Referring again to FIG. 19, the code generating circuit 800 may generate a calibration code CDCA. There may be 1-st to 4-th calibration signals XCPS<1> to XCPS<4> in the calibration code CDCA. The 1-st to 4-th calibration signals XCPS<1> to XCPS<4> may be sequentially activated, and latched in response to the transition from "L" to "H" of the intrinsic output signal XOUT.

The code generating circuit 800 may have the substantially same configuration as the code generating circuit 800 of FIG. 3. Therefore, in this specification, a detailed description thereof omitted.

In summary, in the signal input buffer of the second embodiment, the intrinsic input signal XINT may be controlled as the level of the reference voltage VREF in the k-th calibration period P_CAL<k>. Accordingly, the voltage of the intrinsic input signal XINT induced to the reception response unit URT may be controlled to the level of the reference voltage VREF.

The calibration code CDCA may be sequentially changed, and the transition of the intrinsic output signal XOUT may be monitored. At the transition point from "L" to "H" of the intrinsic output signal XOUT, the calibration code CDCA may be stored, and thereby the offset may be calibrated.

According to the signal input buffer of the disclosure, the time required for offset calibration may be significantly reduced.

For example, according to the signal input buffer of the disclosure, the offset can be calibrated very effectively.

While the disclosure has been described with reference to the embodiments shown in the drawings, these embodiments are merely illustrative and it should be understood that various modifications and other equivalent embodiments can be derived by those skilled in the art on the basis of the embodiments.

It will be apparent to those skilled in the art that various modifications can be made to the above-described embodiments of the disclosure without departing from the spirit or scope of the invention. Thus, it is intended that the disclosure covers all such modifications provided they come within the scope of the appended claims and their equivalents.

What is claimed is:

1. A signal input buffer comprising:
   1-st and 2-nd buffering blocks, each of the 1-st and 2-nd buffering blocks buffering its own input signal pair to generate its own output signal pair, and calibrating its own calibration code in a 1-st calibration period and a 2-nd calibration period, respectively, wherein the input signal pair includes an intrinsic input signal and a complementary input signal, and the output signal pair includes an intrinsic output signal and a complementary output signal;

a 1-st input switching block that electrically connects a reception signal pair to the input signal pair of the 1-st buffering block in the 2-nd calibration period, and blocks electrical connection between the reception signal pair and the input signal pair of the 1-st buffering block in the 1-st calibration period;

a 2-nd input switching block that electrically connects the reception signal pair to the input signal pair of the 2-nd buffering block in the 1-st calibration period, and blocks electrical connection between the reception signal pair and the input signal pair of the 2-nd buffering block in the 2-nd calibration period;

a 1-st output switching block that electrically connects the output signal pair of the 1-st buffering block to a buffered signal pair in the 2-nd calibration period, and blocks electrical connection between the output signal pair of the 1-st buffering block and the buffered signal pair in the 1-st calibration period; and a 2-nd output switching block that electrically connects the output signal pair of the 2-nd buffering block to the buffered signal pair in the 1-st calibration period, and blocks electrical connection between the output signal pair of the 2-nd buffering block and the buffered signal pair in the 2-nd calibration period, wherein the signal input buffer buffers the reception signal pair and generates the buffered signal pair, and is capable of operation in a normal mode and a calibration mode, the reception signal pair includes an intrinsic reception signal and a complementary reception signal, the buffered signal pair includes an intrinsic buffered signal and a complementary buffered signal, the calibration mode includes the 1-st calibration period and the 2-nd calibration period, the k-th input switching block electrically connects the reception signal pair to the input signal pair of the k-th buffering block in the normal mode, 'k' being at least one of 1 and 2, the k-th output switching block electrically connects the output signal pair of the k-th buffering block to the buffered signal in the normal mode, the k-th buffering block includes:

a switching circuit that controls the intrinsic input signal and the complementary input signal to a same voltage level in the k-th calibration period;

a reception circuit that includes a reception response unit and a comparison response unit, and generates the output signal pair, wherein the reception response unit has a reception response conductance which depends on a voltage of the intrinsic input signal, the comparison response unit has a comparison response conductance which depends on a voltage of the complementary input signal, and the output signal pair has a logic state depending on a magnitude relationship between the reception response conductance and the comparison response conductance in the k-th calibration period; and a code generating circuit that generates a calibration code including 1-st to n-th calibration signals sequentially activated, wherein the calibration code is sequentially changed in k-th the calibration period in which a k-th calibration driving signal is activated, and is latched in response to a transition of the intrinsic output signal, a relative magnitude of the comparison response conductance to the reception response conductance is sequentially changed according to the sequential change of the calibration code, in the k-th calibration period, and 'k' is at least one of 1 and 2, and 'n' is a natural number equal to greater than 2.

2. The signal input buffer of claim 1, wherein the reception circuit further includes:

a reception responding part that includes the reception response unit and the comparison response unit, wherein the reception response unit is disposed between a common node and a reception intermediate node, the comparison response unit is disposed between the common node and a comparison intermediate node, and the common node is electrically connected to a power voltage according to activation of a buffer enable signal; and a reception amplifying part that is electrically connected to the reception intermediate node and the comparison intermediate node, and generates the intrinsic output signal and the complementary output signal.

3. The signal input buffer of claim 2, wherein the reception circuit further includes:

an enable transistor disposed between the power voltage and the common node, and electrically connects the common node to the power voltage in response to activation of the buffer enable signal.

4. The signal input buffer of claim 2, wherein the reception response unit includes a reception basic portion and a 1-st to a p-th response portions disposed in parallel with each other between the common node and the reception intermediate node, 'p' being a natural number smaller than n, the reception basic portion has a reception basic conductance depending on the voltage of the intrinsic input signal, the 1-st to p-th response portions are enabled in response to activation of a 1-st to a p-th calibration signal, respectively, and have 1-st to p-th response conductances depending on the voltage of the intrinsic input signal, and the comparison response unit includes a comparison basic portion and (p+1) to n-th response portions disposed in parallel with each other between the common node and the comparison intermediate node, the comparison basic portion has a comparison basic conductance depending on the voltage of the complementary input signal, and the (p+1)-th to n-th response portions are enabled in response to activation of (p+1)-th to n-th calibration signals, respectively, and have (p+1)-th to n-th response conductances depending on the voltage of the complementary input signal.

5. The signal input buffer of claim 4, wherein the 1-st to p-th response conductances are sequentially decreased in the k-th calibration period, and the (p+1)-th to n-th response conductances are sequentially increased in the k-th calibration period.

6. The signal input buffer of claim 5, wherein the comparison response unit further includes a precision response portion that is disposed in parallel with the comparison basic portion and the (p+1)-th to n-th response portions between the common node and the comparison intermediate node, is enabled in the k-th calibration period, and has a precision conductance depending on the voltage of the complementary input signal, and the precision conductance is smaller than the (p+1)-th response conductance.

7. The signal input buffer of claim 6, wherein the reception response unit further includes:

a compensation response portion that is disposed in parallel with the reception basic portion and the 1-st to p-th response portions between the common node and the reception intermediate node, and is disenabled in the k-th calibration period.

8. The signal input buffer of claim 1, wherein

'n' is less than or equal to 2 to the power of 'q', 'q' being a natural number, and the code generating circuit includes:

a coding generating part that generates 1-st to q-th coding signals, wherein the 1-st coding signal alternately rises and falls according to a pulse of an oscillating signal, the oscillating signal is a pulse signal that is periodically and repeatedly activated in the k-th calibration period, and a t-th coding signal alternately rises and falls according to a pulse of a (t−1)-th coding signal, 't' being a natural number from 2 to q;

a sequential signal generating part that generates 1-st to n-th sequential signals with using the 1-st to q-th coding signals, wherein the 1-st to n-th sequential signal are sequentially activated;

a sequential enable generating part that generates a sequential enable signal, wherein the sequential enable signal is activated in response to activation of the k-th calibration driving signal, and the sequential enable signal is deactivated in response to a transition of the intrinsic output signal in the k-th calibration period; and a calibration signal generating part that generates the 1-st to n-th calibration signals with receiving the 1-st to n-th sequential signals, wherein a logic state of an i-th calibration signal corresponds to a logic state of an i-th sequential signal during activation of the sequential enable signal, and is latched in response to deactivation of the sequential enable signal, 'i' being a natural number from 1 to n.

9. The signal input buffer of claim 8, wherein the coding generating part includes 1-st to q-th coding generating units that generate the 1-st to q-th coding signals.

10. The signal input buffer of claim 9, wherein the 1-st coding generating unit includes:

a 1-st input code portion that receives an inverted signal of the 1-st coding signal and generates a 1-st input code signal, wherein the 1-st input code signal is controlled to a logic state that is inverted from the inverted signal of the 1-st coding signal in response to an one-way transition of the oscillating signal, and is latched as a first logic state in response to deactivation of the k-th calibration driving signal; and a 1-st output code portion that generates the 1-st coding signal with inverting the 1-st input code signal in response to other one-way transition of the oscillating signal.

11. The signal input buffer of claim 9, wherein the t-th coding generating unit includes:

a t-th input code portion that receives an inverted signal of the t-th coding signal and generates a t-th input code signal, wherein the t-th input code signal is controlled to a logic state that is inverted from the inverted signal of the t-th coding signal in response to an one-way transition of the (t−1)-th coding signal, and is latched as a first logic state in response to deactivation of the k-th calibration driving signal; and a t-th output code portion that generates the t-th coding signal with inverting the t-th input code signal in response to other one-way transition of the (t−1)-th coding signal.

12. The signal input buffer of claim 9, wherein the sequential enable generating part includes:

an output latch unit that generates the intrinsic output signal as an output latch signal in response to activation of a buffer enable signal; and a sequential enable generating unit that generates the sequential enable signal, wherein the sequential enable signal is activated in response to the activation of the k-th calibration driving signal, and is deactivated in response to a transition of the output latch signal in k-th calibration period.

13. The signal input buffer of claim 12, wherein the output latch unit includes:

a delay enable portion that generates a delay enable signal with using the buffer enable signal, wherein the delay enable signal is activated in response to the activation of the buffer enable signal with a delay; and an output latch portion that generates the intrinsic output signal as the output latch signal in response to activation of the delay enable signal.

14. The signal input buffer of claim 12, wherein the sequential enable generating unit includes:

a calibration pulse generating portion that generates a calibration pulse in response to activation of the k-th calibration driving signal;

a transition signal generating unit that generates a transition pulse in response to transition of the output latch signal; and a sequential enable generating unit that generates the sequential enable signal, wherein the sequential enable signal is activated in response to a pulse generation of the calibration pulse, and is deactivated in response to a pulse generation of the transition pulse.

15. The signal input buffer of claim 9, wherein the calibration signal generating part includes 1-st to n-th calibration generating units, and an i-th calibration generating unit includes:

a calibration switch that transmits the i-th sequential signal in case that the sequential enable signal is activated; and a calibration latch portion that generates an i-th calibration signal, wherein the logic state of the i-th calibration signal corresponds to the logic state of the i-th sequential signal transmitted through the calibration switch, and the logic state of the i-th calibration signal is latched according to deactivation of the sequential enable signal.

16. A signal input buffer comprising:

1-st and 2-nd buffering blocks, each of the 1-st and 2-nd buffering blocks buffering its own intrinsic input signal to generate its own intrinsic output signal;

a 1-st input switching block that electrically connects an intrinsic reception signal to the intrinsic input signal of the 1 st buffering block in a 2-nd calibration period, and blocks electrical connection between the intrinsic reception signal and the intrinsic input signal of the 1-st buffering block in a 1-st calibration period;

a 2-nd input switching block that electrically connects the intrinsic reception signal to the intrinsic input signal of the 2-nd buffering block in the 1-st calibration period, and blocks electrical connection between the intrinsic reception signal and the intrinsic input signal of the 2-nd buffering block in the 2-nd calibration period;

a 1-st output switching block that electrically connects the intrinsic output signal of the 1-st buffering block to an intrinsic buffered signal in the 2-nd calibration period, and blocks electrical connection between the intrinsic output signal of the 1-st buffering block and the intrinsic buffered signal in the 1-st calibration period; and a 2-nd output switching block that electrically connects the intrinsic output signal of the 2-nd buffering block to the intrinsic buffered signal in the 1-st calibration period, and blocks electrical connection between the intrinsic output signal of the 2-nd buffering block and the intrinsic buffered signal in the 2-nd calibration period, wherein the signal input buffer buffers the intrinsic reception signal and generating the intrinsic buffered signal, and is capable of operation in a normal mode and a calibration mode, the calibration mode includes the 1-st calibration period and the 2-nd calibration period, the k-th input switching block electrically connects the intrinsic reception signal to the intrinsic input signal of the k-th buffering block in the normal mode, 'k' being at least one of 1 and 2, the k-th output switching block electrically connects the intrinsic output signal of the k-th buffering block to the intrinsic buffered signal in the normal mode, the k-th buffering block includes:
  a switching circuit that controls the intrinsic input signal to a reference voltage in the k-th calibration period;
  a reception circuit that includes a reception response unit and a comparison response unit, and generates the intrinsic output signal, wherein the reception response unit has a reception response conductance which depends on a voltage of the intrinsic input signal, the comparison response unit has a comparison response conductance which depends on a reference voltage, and the intrinsic output signal has a logic state depending on a magnitude relationship between the reception response conductance and the comparison response conductance in the k-th calibration period; and
  a code generating circuit that generates a calibration code including a 1-st to a n-th calibration signal sequentially activated, wherein the calibration code is sequentially changed in k-th the calibration period in which a k-th calibration driving signal is activated, and is latched in response to a transition of the intrinsic output signal, a relative magnitude of the comparison response conductance to the reception response conductance is sequentially changed according to the sequential change of the calibration code, in the k-th calibration period, and 'k' is at least one of 1 and 2, and 'n' is a natural number equal to greater than 2.

* * * * *